(12) United States Patent (10) Patent No.: US 12,682,818 B2
Matsuzaki et al. (45) Date of Patent: Jul. 14, 2026

(54) SEMICONDUCTOR DEVICE

(71) Applicant: Semiconductor Energy Laboratory Co., Ltd., Kanagawa-ken (JP)

(72) Inventors: Takanori Matsuzaki, Atsugi (JP); Tatsuya Onuki, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/710,857

(22) PCT Filed: Nov. 7, 2022

(86) PCT No.: PCT/IB2022/060669
§ 371 (c)(1),
(2) Date: May 16, 2024

(87) PCT Pub. No.: WO2023/089444
PCT Pub. Date: May 25, 2023

(65) Prior Publication Data
US 2025/0054432 A1 Feb. 13, 2025

(30) Foreign Application Priority Data
Nov. 19, 2021 (JP) ................................ 2021-188587

(51) Int. Cl.
*G09G 3/20* (2006.01)
*H03K 19/0185* (2006.01)
(Continued)

(52) U.S. Cl.
CPC ... *G09G 3/2092* (2013.01); *H03K 19/018521* (2013.01); *H10D 86/423* (2025.01);
(Continued)

(58) Field of Classification Search
CPC ......... G09G 3/2092; G09G 2300/0871; G09G 2310/0289; G09G 2330/021;
(Continued)

(56) References Cited

U.S. PATENT DOCUMENTS 8,455,868 B2 6/2013 Yamazaki et al.
8,547,771 B2 10/2013 Koyama
(Continued)

FOREIGN PATENT DOCUMENTS

CN 107230690 A 10/2017
JP 2011-151383 A 8/2011
(Continued)

OTHER PUBLICATIONS

International Search Report (Application No. PCT/IB2022/060669) Dated Feb. 14, 2023.
(Continued)

*Primary Examiner* — Hang Lin
(74) *Attorney, Agent, or Firm* — Husch Blackwell LLP

(57) ABSTRACT

A semiconductor device (300A) includes a first layer (20) and a second layer (30) over the first layer. The first layer includes a logic circuit portion (23). The second layer includes a level shifter portion (24) and a pixel circuit (51). The logic circuit portion has a function of supplying a first signal for operating the level shifter portion to the level shifter portion. The level shifter portion has a function of supplying a second signal with a larger amplitude than the first signal to the pixel circuit. The logic circuit portion includes a transistor including silicon in a semiconductor layer where a channel is formed. Each of the level shifter portion and the pixel circuit includes a transistor including a metal oxide in a semiconductor layer where a channel is formed.

8 Claims, 21 Drawing Sheets

(51) Int. Cl.
    *H10D 86/40*         (2025.01)
    *H10D 86/60*         (2025.01)

(52) U.S. Cl.
    CPC ..... *H10D 86/60* (2025.01); *G09G 2310/0289* (2013.01); *G09G 2330/021* (2013.01)

(58) Field of Classification Search
    CPC ........... G09G 2310/0286; H10D 86/60; H10D 86/423; H03K 19/018521
    See application file for complete search history.

(56)               References Cited

U.S. PATENT DOCUMENTS

| | | | |
|---|---|---|---|
| 8,995,174 | B2 | 3/2015 | Koyama |
| 9,349,735 | B2 | 5/2016 | Yamazaki et al. |
| 9,590,594 | B2 | 3/2017 | Kozuma |
| 9,991,265 | B2 | 6/2018 | Yamazaki et al. |
| 10,236,330 | B2 | 3/2019 | Maruyama |
| 10,319,743 | B2 | 6/2019 | Kurokawa |
| 10,553,589 | B2 | 2/2020 | Yamazaki et al. |
| 10,886,351 | B2 | 1/2021 | Maruyama |
| 11,177,792 | B2 | 11/2021 | Koyama |
| 11,276,711 | B2 | 3/2022 | Inoue et al. |
| 11,404,516 | B2 | 8/2022 | Maruyama |
| 11,423,844 | B2 | 8/2022 | Ikeda et al. |
| 11,456,296 | B2 | 9/2022 | Yamazaki et al. |
| 11,677,384 | B2 | 6/2023 | Koyama |
| 11,744,111 | B2 | 8/2023 | Maruyama |
| 11,798,491 | B2 | 10/2023 | Ikeda et al. |
| 11,825,665 | B2 | 11/2023 | Yamazaki et al. |
| 12,021,530 | B2 | 6/2024 | Koyama |
| 2017/0278916 | A1 | 9/2017 | Maruyama |
| 2018/0151593 | A1 | 5/2018 | Inoue et al. |
| 2018/0175074 | A1* | 6/2018 | Kurokawa .......... G09G 3/3266 |
| 2019/0165071 | A1 | 5/2019 | Maruyama |
| 2021/0005693 | A1 | 1/2021 | Cho et al. |
| 2021/0083029 | A1 | 3/2021 | Maruyama |
| 2021/0295780 | A1* | 9/2021 | Ikeda .................. G09G 3/3266 |
| 2022/0310735 | A1 | 9/2022 | Maruyama |
| 2023/0075180 | A1 | 3/2023 | Inoue et al. |
| 2023/0354647 | A1 | 11/2023 | Maruyama |
| 2023/0413587 | A1 | 12/2023 | Yamazaki et al. |
| 2024/0062724 | A1 | 2/2024 | Ikeda et al. |

FOREIGN PATENT DOCUMENTS

| | | | |
|---|---|---|---|
| JP | 2012-257187 | A | 12/2012 |
| JP | 2018-093483 | A | 6/2018 |
| JP | 2018-101783 | A | 6/2018 |
| JP | 2020-101829 | A | 7/2020 |
| KR | 2017-0110503 | A | 10/2017 |
| KR | 2018-0061057 | A | 6/2018 |
| KR | 2021-0004794 | A | 1/2021 |
| TW | 201735373 | | 10/2017 |
| TW | 201833898 | | 9/2018 |
| WO | WO-2012/017843 | | 2/2012 |
| WO | WO-2019/220278 | | 11/2019 |

OTHER PUBLICATIONS

Written Opinion (Application No. PCT/IB2022/060669) Dated Feb. 14, 2023.

\* cited by examiner

FIG. 11

| T31 | T32 |

IN {
─ VDD
─ VSS

INB {
─ VDD
─ VSS

N31 {
─ VDDH
─ VSS

OUT {
─ VDDH
─ VDDH−Vth
─ VSS

200A

FIG. 19A
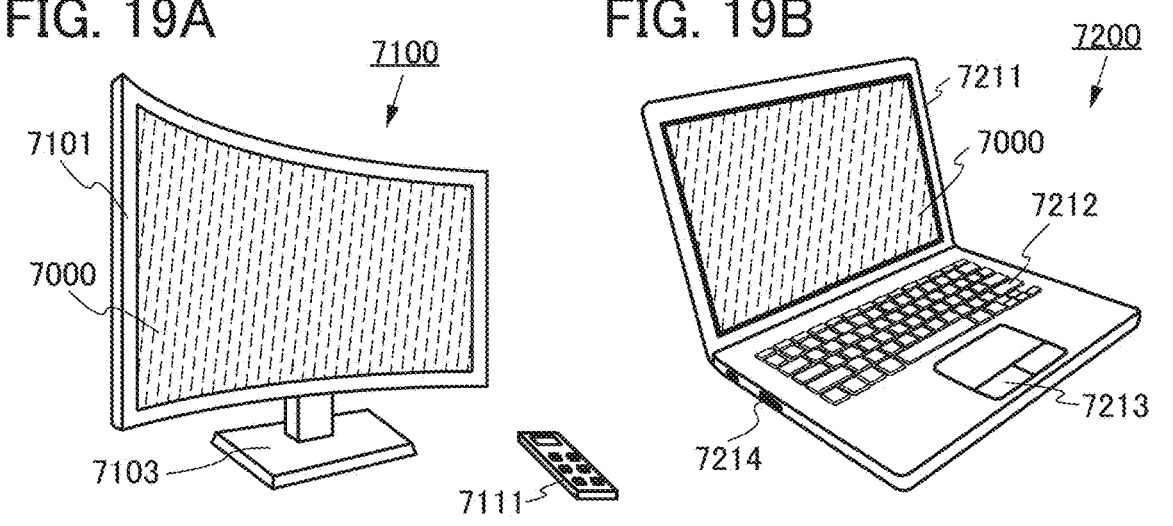
FIG. 19B
FIG. 19C
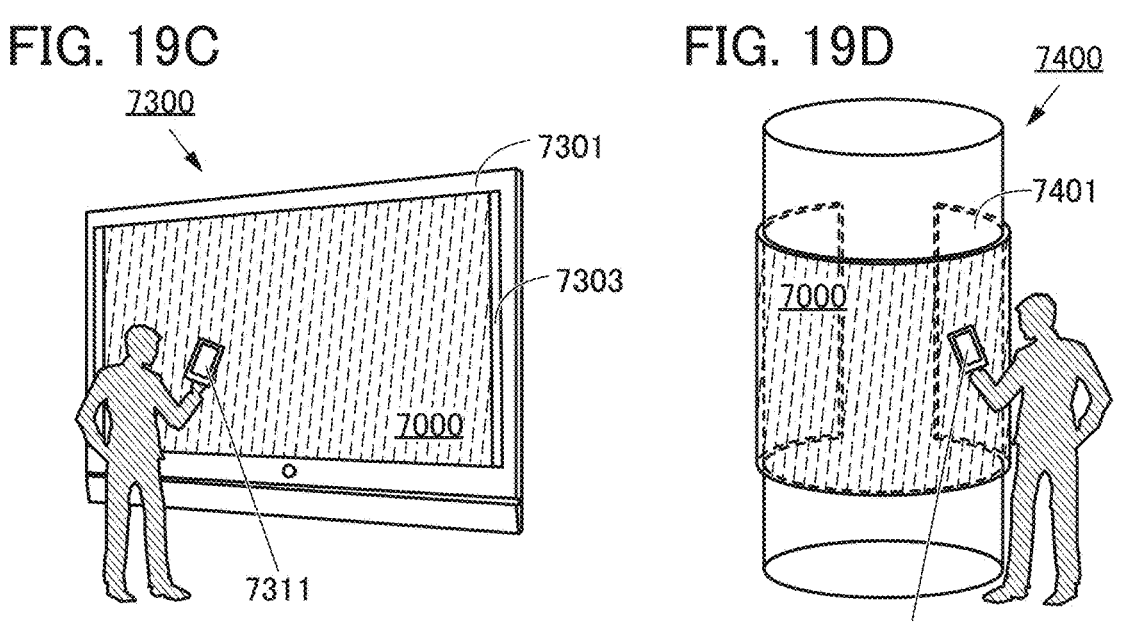
FIG. 19D
FIG. 19E
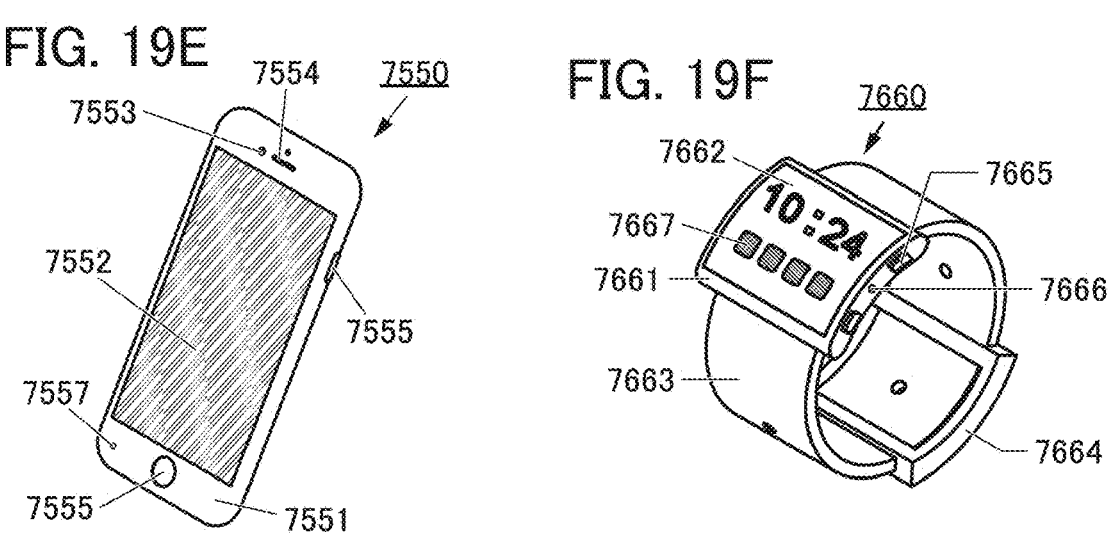
FIG. 19F

SEMICONDUCTOR DEVICE

This application is a 371 of international application PCT/IB2022/060669 filed on Nov. 7, 2022, which is incorporated herein by reference.

TECHNICAL FIELD

One embodiment of the present invention relates to a semiconductor device.

Note that one embodiment of the present invention is not limited to the above technical field. The technical field of one embodiment of the invention disclosed in this specification and the like relates to an object, a method, a driving method, or a manufacturing method. Alternatively, one embodiment of the present invention relates to a process, a machine, manufacture, or a composition of matter. Thus, specific examples of the technical field of one embodiment of the present invention disclosed in this specification and the like include a semiconductor device, a display apparatus, a light-emitting apparatus, a power storage device, an optical device, an image capturing device, a memory device, a signal processing device, an electronic device, a lighting device, an input device, an input/output device, a driving method thereof, and a manufacturing method thereof.

BACKGROUND ART

It is known that a transistor using an oxide semiconductor has an extremely low leakage current in a non-conduction state. For example, Patent Document 1 discloses a low-power-consumption CPU utilizing a feature of a low leakage current of the transistor using an oxide semiconductor. Furthermore, for example, Patent Document 2 discloses a memory device that can retain stored data for a long time by utilizing a feature of a low leakage current of the transistor using an oxide semiconductor.

Patent Document 3 discloses a high-resolution display apparatus with a large number of pixels including light-emitting devices containing organic EL.

In recent years, demand for an integrated circuit with higher density has risen with reductions in the size and weight of electronic devices. Furthermore, an improvement of the productivity of semiconductor devices including integrated circuits is desired.

REFERENCE

Patent Documents

[Patent Document 1] Japanese Published Patent Application No. 2012-257187
[Patent Document 2] Japanese Published Patent Application No. 2011-151383
[Patent Document 3] PCT International Publication No. 2019/220278

SUMMARY OF THE INVENTION

Problems to be Solved by the Invention

In recent years, lower power consumption of electronic devices is required and voltage of integrated circuits are being increasingly lowered. Meanwhile, for example, in order to drive a pixel circuit or the like of a display apparatus with a signal output from an integrated circuit, the signal needs to be boosted by a level shifter. Thus, in the case where an integrated circuit and a pixel circuit are formed over the same substrate, for example, transistors having a high withstand voltage (also referred to as high-withstand-voltage transistors) need to be manufactured, leading to an increase in manufacturing cost.

An object of one embodiment of the present invention is to provide a semiconductor device with low power consumption. Another object of one embodiment of the present invention is to provide a small semiconductor device. Another object of one embodiment of the present invention is to provide a semiconductor device with low manufacturing cost. Another object of one embodiment of the present invention is to provide a highly reliable semiconductor device. Another object of one embodiment of the present invention is to provide a novel semiconductor device.

Means for Solving the Problems (1)

One embodiment of the present invention is a semiconductor device including a first layer and a second layer over the first layer. The first layer includes a logic circuit portion. The second layer includes a level shifter portion and a pixel circuit. The logic circuit portion has a function of supplying a first signal for operating the level shifter portion to the level shifter portion. The level shifter portion has a function of supplying a second signal with a higher amplitude than the first signal to the pixel circuit. The logic circuit portion includes a transistor including silicon in a semiconductor layer where a channel is formed. Each of the level shifter portion and the pixel circuit includes a transistor including a metal oxide in a semiconductor layer where a channel is formed.

(2)

One embodiment of the present invention is a semiconductor device including a first layer, a second layer over the first layer, and a third layer over the second layer. The first layer includes a logic circuit portion. The second layer includes a level shifter portion. The third layer includes a pixel circuit. The logic circuit portion has a function of supplying a first signal for operating the level shifter portion to the level shifter portion. The level shifter portion has a function of supplying a second signal with a larger amplitude than the first signal to the pixel circuit. The logic circuit portion includes a transistor including silicon in a semiconductor layer where a channel is formed. Each of the level shifter portion and the pixel circuit includes a transistor including a metal oxide in a semiconductor layer where a channel is formed.

(3)

In the semiconductor device according to (1) or (2) described above, the level shifter portion includes a first transistor, a second transistor, a third transistor, a fourth transistor, a fifth transistor, and a capacitor. One of a source and a drain of the first transistor is electrically connected to one of a source and a drain of the second transistor. One of a source and a drain of the third transistor is electrically connected to a gate of the fourth transistor. One of a source and a drain of the fourth transistor is electrically connected to one of a source and a drain of the fifth transistor. One terminal of the capacitor is electrically connected to the gate of the fourth transistor. A gate of the first transistor is electrically connected to the one of the source and the drain of the fourth transistor. A gate of the second transistor is electrically connected to a first output terminal of the logic circuit portion. A gate of the fifth transistor is electrically connected to a second output terminal of the logic circuit portion. The other terminal of the capacitor is electrically connected to a third output terminal of the logic circuit portion.

(4)

In the semiconductor device according to any one of (1) to (3) described above, the metal oxide preferably contains at least one of indium and zinc.

Effect of the Invention

One embodiment of the present invention can provide a semiconductor device with low power consumption. Another embodiment of the present invention can provide a small semiconductor device. Another embodiment of the present invention can provide a semiconductor device with low manufacturing cost. Another embodiment of the present invention can provide a highly reliable semiconductor device. Another embodiment of the present invention can provide a novel semiconductor device.

BRIEF DESCRIPTION OF THE DRAWINGS

FIG. 11 is a timing chart showing an operation example of a semiconductor device.

FIG. 19A to FIG. 19F are diagrams each illustrating an example of an electronic device.

MODE FOR CARRYING OUT THE INVENTION

Figure 1:
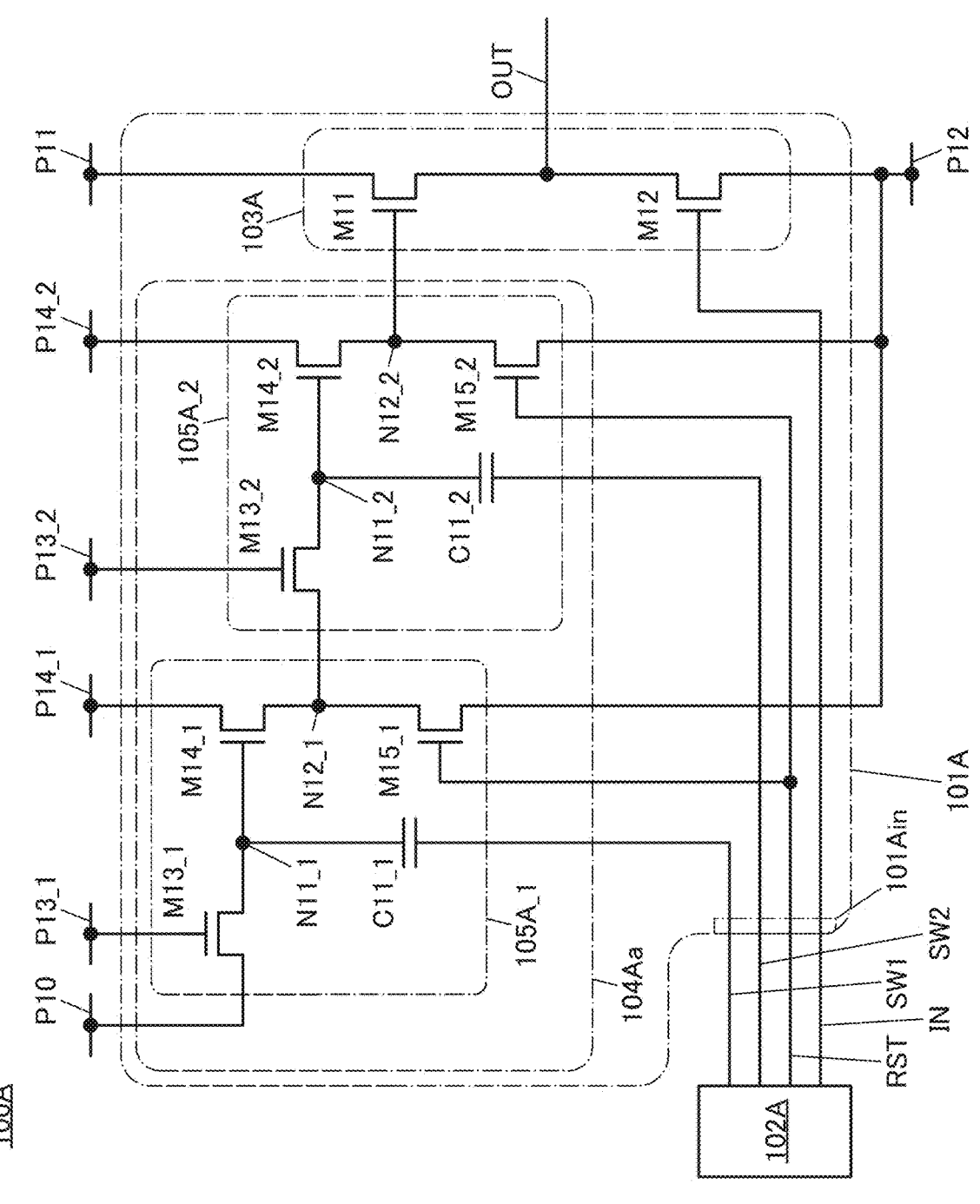
FIG. 1 is a diagram illustrating an example of a semiconductor device.

In this specification and the like, a semiconductor device refers to a device that utilizes semiconductor characteristics, and means a circuit including a semiconductor element (e.g., a transistor, a diode, or a photodiode) or a device including the circuit, for example. The semiconductor device also means all devices that can function by utilizing semiconductor characteristics. For example, an integrated circuit, a chip including an integrated circuit, and an electronic component including a chip in a package are examples of the semiconductor device. Moreover, for example, a memory device, a display apparatus, a light-emitting apparatus, a lighting device, an electronic device, and the like themselves may be semiconductor devices and may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit (e.g., a step-up circuit and a step-down circuit) or a level shifter circuit for changing the potential level of a signal); a voltage source; a current source; a switch circuit; an amplifier circuit (e.g., a circuit that can increase signal amplitude, the current amount, or the like, an operational amplifier, a differential amplifier circuit, a source follower circuit, or a buffer circuit); a signal generation circuit; a memory circuit; or a control circuit) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed that, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed that "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed that "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In addition, in this specification and the like, as a "resistor," a circuit element, a wiring, or the like having a resistance value higher than 0 Ω can be used, for example. Thus, in this specification and the like, examples of the "resistor" include a wiring having a resistance value, a transistor in which current flows between its source and drain, a diode, and a coil. Thus, the term "resistor" can be replaced with the terms "resistance," "load," or "region having a resistance value". Conversely, the terms "resistance," "load," or "region having a resistance value" can be sometimes replaced with the term "resistor," for example. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9\Omega$.

In the case where a wiring is used as a resistor, the resistance value of the resistor is sometimes determined depending on the length of the wiring. Alternatively, a conductor with resistivity different from that of a conductor used as a wiring is sometimes used as a resistor. Alternatively, in the case where a semiconductor is used as a resistor, the resistance value of the resistor is sometimes determined by doping the semiconductor with an impurity.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Thus, in this specification and the like, a "capacitor" is not limited to only a circuit element that has a pair of electrodes and a dielectric between the electrodes. A "capacitor" includes, for example, parasitic capacitance generated between wirings, gate capacitance generated between a gate and one of a source and a drain of a transistor, and the like. The term "capacitor", "parasitic capacitance", "gate capacitance", or the like can be replaced with the term "capacitance" and the like, for example. Conversely, the term "capacitance" can be replaced with the term "capacitor", "parasitic capacitance", "gate capacitance", or the like, for example. The term "a pair of electrodes" of a "capacitor" can be replaced with "a pair of conductors", "a pair of conductive regions", "a pair of regions", or the like, for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 µF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, each of the gates may be referred to as a first gate, a second gate, or a third gate, for example, in this specification and the like.

In this specification and the like, a "node" can be referred to as a "terminal", a "wiring", an "electrode", a "conductive layer", a "conductor", an "impurity region", or the like depending on the circuit structure, the device structure, or the like, for example. Furthermore, a "terminal", a "wiring", or the like can be referred to as a "node", for example.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Note that a potential is relative. Moreover, potentials are relative values. That is, a potential supplied to a wiring, a potential applied to a circuit and the like, or a potential output from a circuit and the like, for example, are changed with a change of the reference potential.

In this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

In this specification and the like, "current" means a charge transfer (electrical conduction). For example, the description "electrical conduction of positively charged particles occurs" can be rephrased as "electrical conduction of negatively charged particles occurs in the opposite direction". Thus, unless otherwise specified, "current" in this specification and the like refers to a charge transfer phenomenon (electrical conduction) accompanied by carrier movement. Examples of a carrier here include an electron, a hole, an anion, a cation, and a complex ion. The type of carrier differs depending on current-flowing systems (e.g., a semiconductor, a metal, an electrolyte solution, or a vacuum). For example, the "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A" and the like, for example. The description "current is input to element A" and the like can be rephrased as "current is output from element A" and the like, for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, for example, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the terms for describing arrangement in this specification and the like are not limited to those and can be replaced with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°. Moreover, the expression "an insulator located over (on) a top surface of a conductor" can be replaced with the expression "an insulator located on a left surface (or a right surface) of a conductor" when the direction of a drawing showing these components is rotated by 90°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where the electrode B is formed over the insulating layer A. The expression "electrode B overlapping with insulating layer A", for example, does not exclude the state where the electrode B is formed under the insulating layer A and the state where the electrode B is formed on the right side (or the left side) of the insulating layer A.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the term "film", "layer", or the like can be, for example, interchanged with each other depending on the situation, in some cases. For example, the term "conductive layer" can be changed into the term "conductive film" in some cases. For another example, the term "insulating film" can be changed into the term "insulating layer" in some cases. Alternatively, for example, the term "film", "layer", or the like is not used and can be interchanged with another term depending on the situation, in some cases. For example, the term "conductive layer" or "conductive film" can be changed into the term "conductor" in some cases. Furthermore, the term "conductor" can be changed into the term "conductive layer" or "conductive film" in some cases. For example, the term "insulating layer" or "insulating film" can be changed into the term "insulator" in some cases. Furthermore, the term "insulator" can be changed into the term "insulating layer" or "insulating film" in some cases.

In addition, in this specification and the like, for example, the term such as "electrode", "wiring", or "terminal" does not limit the function of a component. For example, an "electrode" is used as part of a wiring in some cases, and vice versa. Furthermore, the term "electrode" or "wiring" also includes, for example, the case where a plurality of "electrodes" or "wirings" are formed in an integrated manner. For example, a "terminal" is used as part of a "wiring", an "electrode", or the like in some cases, and vice versa. Furthermore, the term "terminal" also includes the case where a plurality of "electrodes", "wirings", "terminals", or the like are formed in an integrated manner, for example. Thus, for example, an "electrode" can be part of a "wiring" or a "terminal". Furthermore, a "terminal" can be part of a "wiring" or an "electrode". Moreover, the term "electrode", "wiring", "terminal", or the like is sometimes replaced with the term "region", for example.

In addition, in this specification and the like, for example, the terms such as "wiring", "signal line", and "power supply line" can be interchanged with each other depending on the situation, in some cases. For example, the term "wiring" can be changed into the term "signal line" in some cases. For another example, the term "wiring" can be changed into the term "power supply line" or the like in some cases. Conversely, for example, the term "signal line", "power supply line", or the like can be changed into the term "wiring" in some cases. Furthermore, for example, the term "power supply line" or the like can be changed into the term "signal line" or the like in some cases. Conversely, for example, the term "signal line" or the like can be changed into the term "power supply line" or the like in some cases. Moreover, the term "potential" that is applied to a wiring can be changed into the term "signal" or the like depending on the situation, for example. Conversely, for example, the term "signal" or the like can be changed into the term "potential" in some cases.

In this specification and the like, a "switch" includes a plurality of terminals and has a function of switching (selecting) electrical continuity and discontinuity between the terminals. For example, in the case where a switch includes two terminals and electrical continuity is established between the two terminals, the switch is in a "conduction state" or an "on state". In the case where electrical continuity is not established between the two terminals, the switch is in a "non-conduction state" or an "off state". Note that switching to one of a conduction state and a non-conduction state or maintaining one of a conduction state and a non-conduction state is sometimes referred to as "controlling a conduction state".

That is, a switch has a function of controlling whether current flows therethrough or not. Alternatively, a switch has a function of selecting and changing a current path. For example, an electrical switch or a mechanical switch can be used as the switch. That is, a switch can be any element capable of controlling current, and is not limited to a particular element.

Note that as a kind of a switch, there is a switch which is normally in a non-conduction state and brought into a conduction state by controlling a conduction state; such a switch is referred to as an "A contact" in some cases. Furthermore, as another kind of a switch, there is a switch which is normally in a conduction state and brought into a non-conduction state by controlling a conduction state; such a switch is referred to as a "B contact" in some cases.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" or "on state" of the transistor refers to a state where a source electrode and a drain electrode of the transistor can be regarded as being electrically short-circuited. Furthermore, a "non-conduction state" or "off state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction state with the movement of the electrode.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, for example, the terms "identical", "the same", "equal", "uniform", and the like (including synonyms of these words) used in describing calculation values and measurement values or in describing objects, methods, events, and the like that can be converted into calculation values or measurement values, allow for a margin of error of ±20% unless otherwise specified.

In this specification and the like, an impurity in a semiconductor refers to, for example, an element other than a main component of a semiconductor layer. For example, an element with a concentration of lower than 0.1 atomic % is an impurity. When an impurity is contained in a semiconductor, for example, the density of defect states in a semiconductor is increased, carrier mobility is decreased, or crystallinity is decreased in some cases. In the case where the semiconductor is an oxide semiconductor, examples of an impurity that changes the characteristics of the semiconductor include Group 1 elements, Group 2 elements, Group 13 elements, Group 14 elements, Group 15 elements, or transition metals other than the main components of the oxide semiconductor. Specific examples include hydrogen (included also in water), lithium, sodium, silicon, boron, phosphorus, carbon, and nitrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like, for example. For example, in the case where a metal oxide is used in a semiconductor layer of a transistor, the metal oxide is referred to as an oxide semiconductor in some cases. That is, when a metal oxide is used as a material that can be used for a channel formation region of a transistor that has at least one of an amplifying function, a rectifying function, and a switching function, the metal oxide can be referred to as a metal oxide semiconductor. In addition, the term "OS transistor" can also be referred to as a transistor containing a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined with each other as appropriate.

Embodiments described in this specification are described with reference to the drawings. Note that the embodiments can be implemented in many different modes. Thus, it will be readily understood by those skilled in the art that the modes and details can be changed in various ways without departing from the spirit and scope thereof. Thus, the present invention should not be interpreted as being limited to the description in the embodiments. As for the drawings illustrating the embodiments, in the structures of the invention, the same reference numerals are used in common for the same portions or portions having similar functions in different drawings, and repeated description thereof is omitted in some cases. Furthermore, the same hatch pattern is used for the portions having similar functions throughout the drawings, and the portions are not especially denoted by reference numerals in some cases. Moreover, some components are omitted in a perspective view, a top view, and the like for easy understanding of the drawings in some cases. In the drawings, for example, a hatching pattern or the like is omitted in some cases.

In addition, in the drawings and the like in this specification, the size, the layer thickness, or the region is exaggerated for clarity in some cases. Thus, the drawings are not necessarily limited to the drawings with the illustrated size, aspect ratio, and the like, for example. Note that the drawings schematically illustrate ideal examples, and embodiments of the present invention are not limited to shapes, values, and the like illustrated in the drawings, for example. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals, for example.

Embodiment 1

A semiconductor device of one embodiment of the present invention is described. The semiconductor device of one embodiment of the present invention can be used for a driver circuit for driving a pixel circuit included in a display apparatus, for example.
<Structure Example>
FIG. 1 illustrates a circuit structure example of a semiconductor device 100A.

The semiconductor device 100A includes a level shifter portion 101A and a logic circuit portion 102A. The level shifter portion 101A includes a plurality of input terminals and at least one output terminal. The logic circuit portion 102A includes a plurality of output terminals. Each of the plurality of input terminals included in the level shifter portion 101A are electrically connected to the plurality of output terminals included in the logic circuit portion 102A.

Specifically, in this embodiment and the like, four input terminals (an input terminal portion 101Ain) included in the level shifter portion 101A are electrically connected to four output terminals of the logic circuit portion 102A through a wiring IN, a wiring RST, a wiring SW1, and a wiring SW2.

An output terminal included in the level shifter portion 101A is electrically connected to a wiring OUT.

The logic circuit portion 102A has a function of outputting a signal necessary for operating the level shifter portion 101A to each of the wiring IN, the wiring RST, the wiring SW1, and the wiring SW2. The level shifter portion 101A has a function of outputting, to the wiring OUT, a signal boosted using signals input from the wiring IN, the wiring RST, the wiring SW1, and the wiring SW2 to a potential higher than those of the input signals. That is, the semiconductor device 100A of one embodiment of the present invention has a function of outputting a signal having a larger amplitude than a signal output from the logic circuit portion 102A, through the level shifter portion 101A.

The level shifter portion 101A includes a signal booster portion 104Aa and a signal output portion 103A. The signal booster portion 104Aa includes a booster stage 105A_1 and a booster stage 105A_2. The booster stage 105A_1 includes a transistor M13_1, a transistor M14_1, a transistor M15_1, and a capacitor C11_1. The booster stage 105A_2 includes a transistor M13_2, a transistor M14_2, a transistor M15_2, and a capacitor C11_2. The signal output portion 103A includes a transistor M11 and a transistor M12.

A gate of the transistor M13_1 is electrically connected to a wiring P13_1, one of a source and a drain of the transistor M13_1 is electrically connected to a gate of the transistor M14_1, and the other of the source and the drain of the transistor M13_1 is electrically connected to a wiring P10.

One of a source and a drain of the transistor M14_1 is electrically connected to one of a source and a drain of the transistor M15_1, and the other of the source and the drain of the transistor M14_1 is electrically connected to a wiring P14_1.

A gate of the transistor M15_1 is electrically connected to the wiring RST, and the other of the source and the drain of the transistor M15_1 is electrically connected to a wiring P12.

One terminal of the capacitor C11_1 is electrically connected to the gate of the transistor M14_1, and the other terminal of the capacitor C11_1 is electrically connected to the wiring SW1.

A gate of the transistor M13_2 is electrically connected to a wiring P13_2, one of a source and a drain of the transistor M13_2 is electrically connected to a gate of the transistor M14_2, and the other of the source and the drain of the transistor M13_2 is electrically connected to one of the source and the drain of the transistor M14_1.

One of a source and a drain of the transistor M14_2 is electrically connected to one of a source and a drain of the transistor M15_2, and the other of the source and the drain of the transistor M14_2 is electrically connected to a wiring P14_2.

A gate of the transistor M15_2 is electrically connected to the wiring RST, and the other of the source and the drain of the transistor M15_2 is electrically connected to the wiring P12.

One terminal of the capacitor C11_2 is electrically connected to the gate of the transistor M14_2, and the other terminal of the capacitor C11_2 is electrically connected to the wiring SW2.

A gate of the transistor M11 is electrically connected to one of the source and the drain of the transistor M14_2, one of a source and a drain of the transistor M11 is electrically connected to the wiring OUT, and the other of the source and the drain of the transistor M11 is electrically connected to a wiring P11.

A gate of the transistor M12 is electrically connected to the wiring IN, one of a source and a drain of the transistor M12 is electrically connected to the wiring OUT, and the other of the source and the drain of the transistor M12 is electrically connected to the wiring P12.

Note that a region where the one of the source and the drain of the transistor M13_1, the gate of the transistor M14_1, and the one terminal of the capacitor C11_1 are electrically connected to each other is also referred to as a node N11_1.

A region where the one of the source and the drain of the transistor M14_1, the one of the source and the drain of the transistor M15_1, and the other of the source and the drain of the transistor M13_2 are electrically connected to each other is also referred to as a node N12_1.

A region where the one of the source and the drain of the transistor M13_2, the gate of the transistor M14_2, and the one terminal of the capacitor C11_2 are electrically connected to each other is also referred to as a node N11_2.

A region where the one of the source and the drain of the transistor M14_2, the one of the source and the drain of the transistor M15_2, and the gate of the transistor M11 are electrically connected to each other is also referred to as a node N12_2.

Note that the wiring SW1 and the node N11_1 are capacitively coupled through the capacitor C11_1. Thus, the capacitor C11_1 has a function of changing the potential of the node N11_1 in accordance with a signal supplied to the wiring SW1.

The wiring SW2 and the node N11_2 are capacitively coupled through the capacitor C11_2. Thus, the capacitor C11_2 has a function of changing the potential of the node N11_2 in accordance with a signal supplied to the wiring SW2.

As described above, the level shifter portion 101A included in the semiconductor device 100A of one embodiment of the present invention has a function of changing the potential by capacitive coupling in the signal booster portion. Thus, in this specification and the like, a circuit structure like that of the level shifter portion 101A is referred to as a "capacitive coupling type level shifter" in some cases.

A transistor containing any of various semiconductors can be used in the semiconductor device 100A of one embodiment of the present invention. For example, a transistor containing a single crystal semiconductor, a polycrystalline semiconductor, a microcrystalline semiconductor, or an amorphous semiconductor in a channel formation region can be used. Furthermore, for example, a compound semiconductor (e.g., silicon germanium (SiGe) or gallium arsenide (GaAs)), an oxide semiconductor, or the like as well as a single element semiconductor whose main component is a single element (e.g., silicon (Si) or germanium (Ge)) can be used.

Any of transistors having a variety of structures can be used in the semiconductor device 100A of one embodiment of the present invention. For example, any of transistors having a variety of structures of a planar type, a FIN-type, a TRI-GATE type, a top-gate type, a bottom-gate type, and a dual-gate type (a structure in which gates are placed above and below a channel) can be used. A MOS transistor, a junction transistor, a bipolar transistor, or the like can be used, for example, as the transistor of one embodiment of the present invention.

The semiconductor device 100A may include a plurality of kinds of transistors formed using different semiconductor materials. For example, the logic circuit portion 102A is preferably formed using a Si transistor (a transistor including silicon in a semiconductor layer where a channel is formed), and the level shifter portion 101A is preferably formed using an OS transistor (a transistor including an oxide semiconductor in a semiconductor layer where a channel is formed).

The Si transistor has higher operation speed than the OS transistor. For example, by electrically connecting a gate of an n-channel Si transistor and a gate of a p-channel Si transistor, a CMOS circuit (e.g., a circuit that operates complementarily, a CMOS logic gate, a CMOS logic circuit, or the like) can be formed. Thus, the operation speed of the logic circuit portion 102A in the semiconductor device 100A of one embodiment of the present invention can be increased, and power consumption in a steady state can be reduced.

The OS transistor has a higher withstand voltage between its source and drain than the Si transistor with the same channel size as the OS transistor. Accordingly, when the OS transistor is used for the transistor included in the level shifter portion 101A in the semiconductor device 100A of one embodiment of the present invention, the semiconductor device 100A can be operated by applying a voltage higher than a withstand voltage of the Si transistor between the source and the drain of the transistor. Furthermore, a semiconductor device with stable operation and high reliability even when a high voltage is applied can be obtained.

The upper limit of the amplitude of the signal output from the logic circuit portion 102A including the Si transistor depends on the withstand voltage of the Si transistor. Hence, the level shifter portion 101A is formed with the OS transistor having a higher withstand voltage than the Si transistor, whereby the semiconductor device 100A of one embodiment of the present invention can output a signal whose amplitude is larger than that of a signal output from the logic circuit portion 102A through the level shifter portion 101A.

In the case where Si transistors with a high withstand voltage (also referred to as high-withstand-voltage Si transistor) are employed in part or the whole of transistors included in the level shifter portion 101A, and the high-withstand-voltage Si transistors are manufactured separately from the Si transistor included in the logic circuit portion 102A, the manufacturing cost is increased by manufacturing the high-withstand-voltage Si transistor. In the semiconductor device 100A of one embodiment of the present invention, the level shifter portion 101A can be formed without employing the high-withstand-voltage Si transistor. Accordingly, the manufacturing cost can be reduced.

Since an oxide semiconductor where a channel of an OS transistor is formed has a band gap greater than or equal to 2 eV, the off-state current is significantly low.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). Thus, the off-state current of the OS transistor is lower than the off-state current of the Si transistor by approximately ten orders of magnitude.

For example, when the OS transistor is used as the transistor included in the level shifter portion 101A, a potential boosted at each of the nodes (the node N11_1, the node N12_1, the node N11_2, and the node N12_2) is can be retained for a long time.

The off-state current of the OS transistor hardly increases even in a high-temperature environment. Specifically, the off-state current of the OS transistor hardly increases even at an environment temperature higher than or equal to room temperature and lower than or equal to 200° C. Furthermore, the on-state current of the OS transistor is unlikely to decrease even in a high-temperature environment. A semiconductor device including the OS transistor can operate stably and have high reliability even in a high-temperature environment.

The semiconductor layer of the OS transistor preferably contains at least one of indium and zinc. The semiconductor layer of the OS transistor preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, the element M is preferably one or more kinds selected from gallium, aluminum, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

When the semiconductor layer is an In-M-Zn oxide, the atomic ratio of In is preferably higher than or equal to the atomic ratio of M in the In-M-Zn oxide. Examples of the atomic ratio of the metal elements in such In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. The atomic ratio of In may be smaller than the atomic ratio of M in the In-M-Zn oxide. Note that the off-state current value per micrometer of channel width of a Si transistor at room temperature is higher than or equal to 1 fA ($1\times10^{-15}$ A) and lower than or equal to 1 pA ($1\times10^{-12}$ A). Note that a composition in the neighborhood includes the range of ±30% of an intended atomic ratio.

For example, when the atomic ratio is described as In:Ga:Zn=4:2:3 or a composition in the neighborhood thereof, the case is included where the content ratio of each element is as follows; Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the content ratio of each element is as follows; Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where the content ratio of each element is as follows; Ga is greater than 0.1 and less than or equal to 2 and Zn is greater than 0.1 and less than or equal to 2 with In being 1.

In the case where the semiconductor device includes a plurality of kinds of transistors formed using different semiconductor materials, the transistors may be provided in different layers for each kind of transistor. For example, in this embodiment and the like, the Si transistor included in the logic circuit portion 102A and the OS transistors included in the level shifter portion 101A may be provided in different layers. Alternatively, a layer including the Si transistor (e.g., a layer including the logic circuit portion 102A) and a layer including the OS transistors (e.g., a layer including the level shifter portion 101A) may be provided to overlap with each other. This structure reduces the area occupied by the semiconductor device 100A. Accordingly, the semiconductor device 100A can be downsized.

The semiconductor device 100A of one embodiment of the present invention can be used for a driver circuit for driving a pixel circuit included in a display apparatus, for example. The OS transistor may be used as the transistor included in the pixel circuit. The pixel circuit may be provided in the same layer as a layer where the level shifter portion 101A is provided, or may be provided in different layers. In the case where the pixel circuit and the level shifter are provided in different layers, a layer where the pixel circuit is provided and the layer where the level shifter portion 101A is provided may be provided to overlap with each other. The detailed description of the display apparatus using the semiconductor device of one embodiment of the present invention will be described later.

A whole or part of the transistors included in the semiconductor device 100A may each be a transistor having a back gate. By providing the back gate, an electric field generated outside the transistor is unlikely to affect a channel formation region; thus, the operation of the semiconductor device is stabilized and the reliability of the semiconductor device can be increased. When the back gate of the transistor is supplied with the same potential as the potential supplied to the gate, the on-state resistance of the transistor can be reduced. By controlling the potentials of the back gate and the gate of the transistor independently of each other, the threshold voltage of the transistor can be changed.

Figure 2:
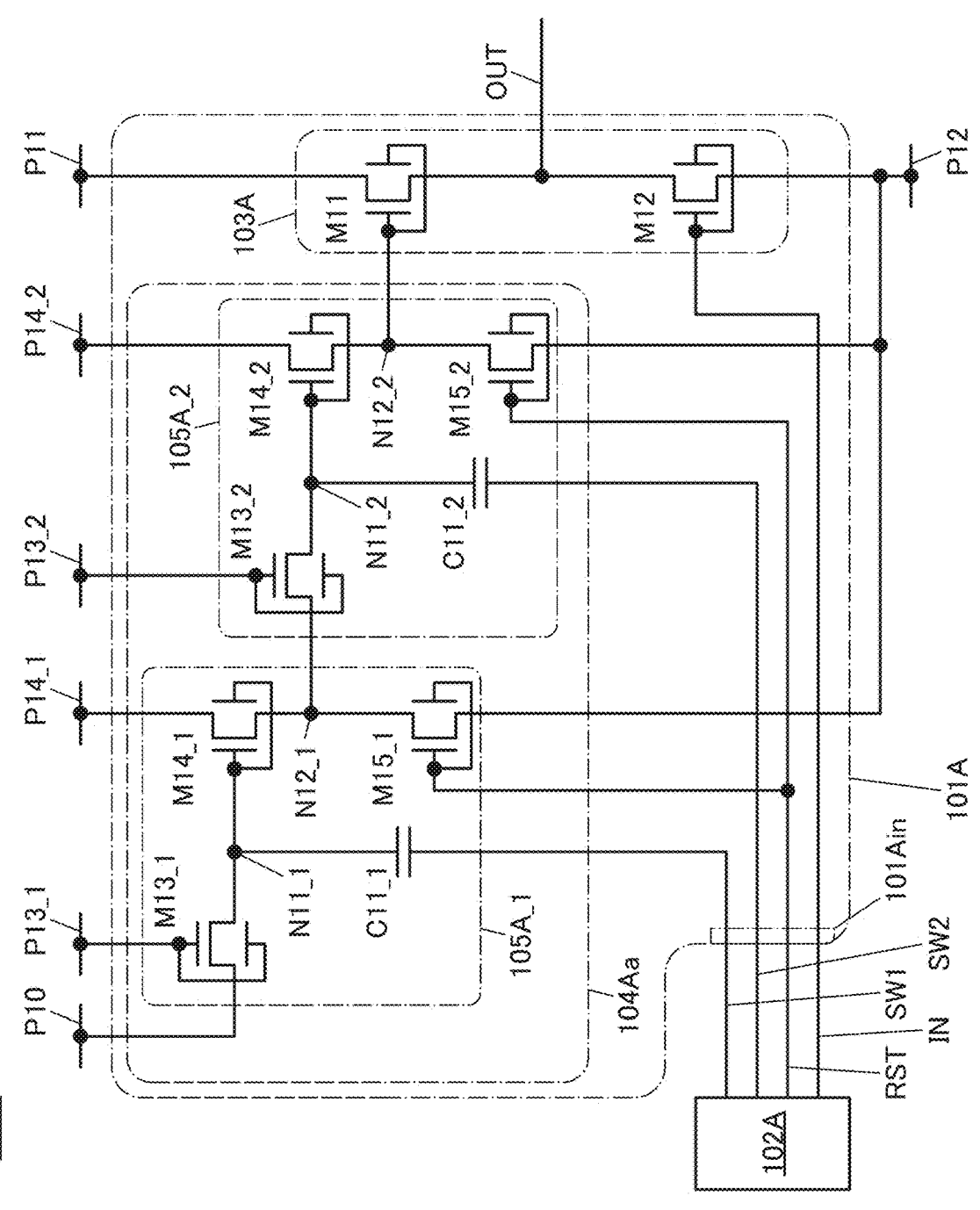
FIG. 2 is a diagram illustrating an example of a semiconductor device.

FIG. 2 illustrates a circuit structure example in which the level shifter portion 101A of the semiconductor device 100A is formed using transistors including back gates. FIG. 2 illustrates an example in which a gate and a back gate are electrically connected to each other in each of the transistor M11, the transistor M12, the transistor M13_1, the transistor M14_1, the transistor M15_1, the transistor M13_2, the transistor M14_2, and the transistor M15_2. Note that not all the transistors included in the semiconductor device necessarily have a back gate.

It is not necessary to electrically connect the gate and the back gate, and a given potential may be supplied to the back gate. Note that the potential supplied to the back gate is not limited to a fixed potential. The potentials supplied to the back gates of the transistors included in the semiconductor device may be different from one another or may be the same.

<Operation Example>

Figure 3:
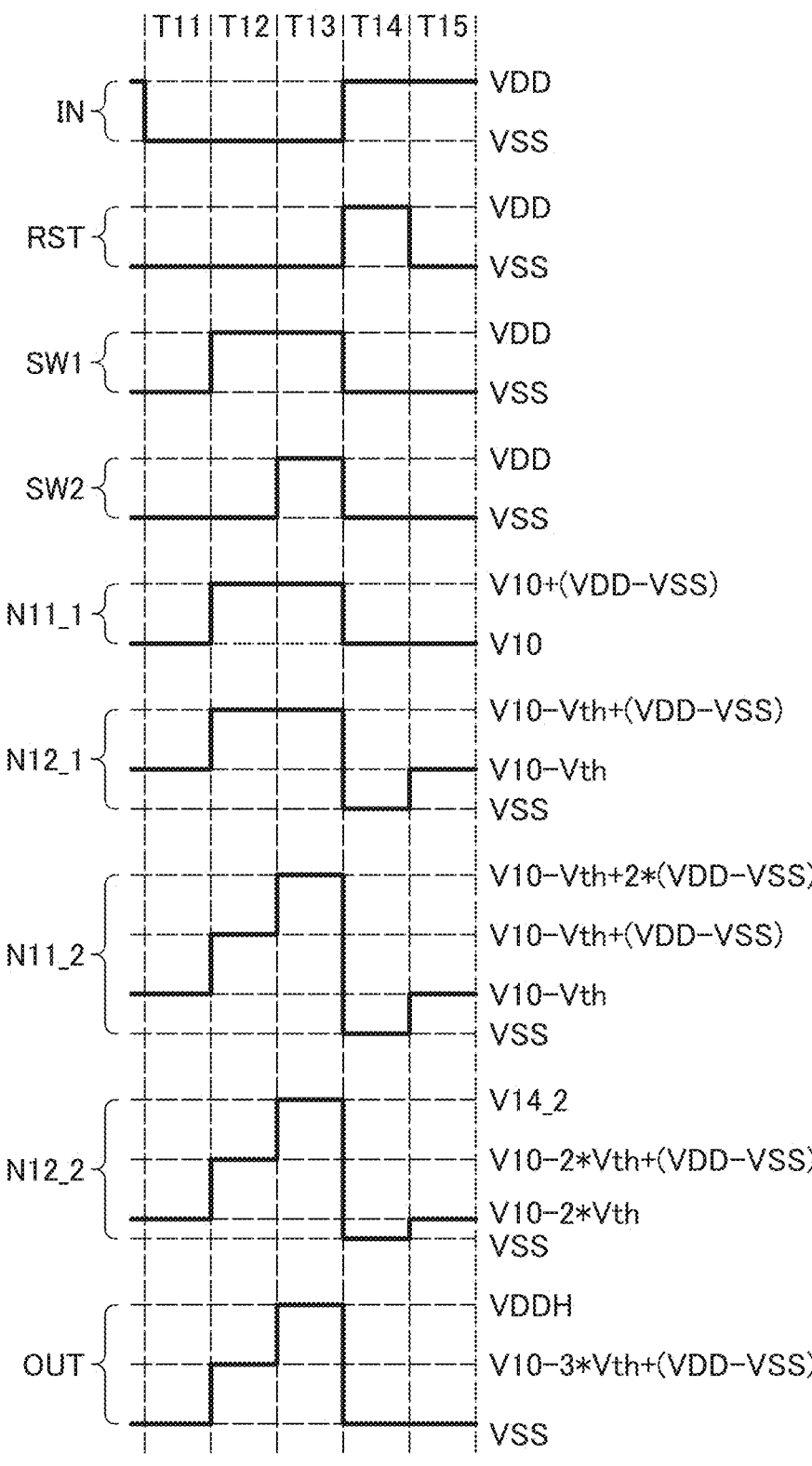
FIG. 3 is a timing chart showing an operation example of a semiconductor device.

Next, an operation example of the semiconductor device 100A is described. FIG. 3 is a timing chart showing the operation example of the semiconductor device 100A.

The logic circuit portion 102A included in the semiconductor device 100A is operated when a potential VSS and a potential VDD are supplied, for example. Thus, the potential of a signal output from the logic circuit portion 102A (the signals supplied to the wiring IN, the wiring RST, the wiring SW1, and the wiring SW2) is the potential VSS or the potential VDD. In the case where the Si transistor is used in the logic circuit portion 102A in this embodiment and the like, the potential difference between the potential VDD and the potential VSS (the potential VDD–the potential VSS) is preferably higher than the threshold voltage of the Si transistor and is preferably lower than the withstand voltage of the Si transistor.

The level shifter portion 101A has a function of outputting a potential VDDH or the potential VSS to the wiring OUT on the basis of the signals supplied to the wiring IN, the wiring RST, the wiring SW1, and the wiring SW2 from the logic circuit portion 102A upon supply of the potential VDDH to the wiring P11, supply of the potential VSS to the wiring P12, and supply of a potential V10, a potential V13_1, a potential V14_1, a potential V13_2, and a potential V14_2 to the wiring P10, the wiring P13_1, the wiring P14_1, the wiring P13_2, and the wiring P14_2, respectively. Note that in this embodiment and the like, in the case where the OS transistors are used for the level shifter portion 101A, the potential VDDH, the potential V10, the potential V13_1, the potential V14_1, the potential V13_2, and the potential V14_2 may be potentials higher than the potential VDD.

In this embodiment and the like, for example, the potential VSS is set at 0 V and the potential VDD is set at 3 V. As another example, the potential VDDH is set at 6 V. As another example, the potential V10, the potential V13_1, the potential V14_1, the potential V13_2, and the potential V14_2 are set at 3 V, 4 V, 6 V, 6 V, and 7 V, respectively. As another example, the threshold voltage Vth of the transistors (e.g., the OS transistor) included in the level shifter portion 101A is set at 1 V.

[High Potential Output]

Period T11 to Period T13 are periods in which an operation of outputting the high potential (the potential VDDH) to the wiring OUT is performed.

First, in Period T11, the potential VSS (0 V) is supplied to the wiring IN. The potential VSS (0 V) is supplied to each of the wiring RST, the wiring SW1, and the wiring SW2. This brings the transistor M12 into an off state. Furthermore, the transistor M15_1 and the transistor M15_2 are in an off state.

Thus, the potentials of the node N11_1, the node N12_1, the node N11_2, the node N12_2, and the wiring OUT become 3 V, 2 V, 2 V, 1 V, and 0 V, respectively.

Next, in Period T12, the potential VDD (3 V) is supplied to the wiring SW1. Then, since the wiring SW1 and the node N11_1 are capacitively coupled through the capacitor C11_1, the potential of the node N11_1 is increased by the potential difference (3 V) of the "the potential VDD–the potential VSS". At this time, the potential of the node N11_1 is maintained by setting the potential V13_1 as appropriate so that the transistor M13_1 is in an off state. As the potential of the node N11_1 is increased, the potentials of the node N12_1, the node N11_2, the node N12_2, and the wiring OUT are increased.

Thus, the potentials of the node N11_1, the node N12_1, the node N11_2, the node N12_2, and the wiring OUT become 6 V, 5 V, 5 V, 4 V, and 3 V, respectively.

Next, in Period T13, the potential VDD (3 V) is supplied to the wiring SW2. Then, since the wiring SW2 and the node N11_2 are capacitively coupled through the capacitor C11_2, the potential of the node N11_2 is increased by the potential difference (3 V) of the "potential VDD–the potential VSS". At this time, the potential of the node N11_2 is maintained by setting the potential V13_2 appropriately so that the transistor M13_2 is in an off state. As the potential of the node N11_2 is increased, the potentials of the node N12_2 and the wiring OUT are increased.

Accordingly, the potentials of the node N11_1, the node N12_1, the node N11_2, the node N12_2, and the wiring OUT become 6 V, 5 V, 8 V, 7 V, and 6 V, respectively.

[Low Potential Output]

Period T14 and Period T15 are periods in which an operation of outputting the low potential (the potential VSS) to the wiring OUT is performed.

First, in Period T14, the potential VDD (3 V) is supplied to each of the wiring IN and the wiring RST, and the potential VSS (0 V) is supplied to each of the wiring SW1 and the wiring SW2. This brings the transistor M12, the transistor M15_1, and the transistor M15_2 into an on state. Accordingly, the potential VSS (0 V) is supplied to the node N12_1, the node N11_2, the node N12_2, and the wiring OUT. This brings the transistor M14_2 and the transistor M11 into an off state.

Note that the potential of the node N11_1 becomes the potential V10, that is, 3 V. This brings the transistor M14_1 into an on state, and current flows from the wiring P14_1 to the wiring P12 through the transistor M14_1 and the transistor M15_1. Thus, Period T14 is preferably a short time, and when the transistor M14_2 and the transistor M11 are brought into an off state, the operation in next Period T15 is preferably performed.

Next, in Period T15, the potential VSS (0 V) is supplied to the wiring RST. The potential VDD (3 V) is supplied to the wiring IN. This brings the transistor M15_1 and the transistor M15_2 into an off state. Furthermore, the transistor M12 is in an on state.

Thus, the potentials of the node N11_1, the node N12_1, the node N11_2, the node N12_2, and the wiring OUT become 3 V, 2 V, 2 V, 1 V, and 0 V, respectively.

In this manner, in the semiconductor device 100A of one embodiment of the present invention, the potential boosted from the potential VDD (3 V) to the potential VDDH (6 V) can be output by performing the operation in Period T11 to Period T13, and the potential VSS (0 V) can be output by performing the operation in Period T14 and Period T15.

For the semiconductor device 100A of one embodiment of the present invention, the Si transistor can be used as a transistor included in the logic circuit portion 102A, and the OS transistor can be used as a transistor included in the level shifter portion 101A. The OS transistor has a higher withstand voltage than the Si transistor. In the case where the semiconductor device 100A is used as a driver circuit for driving a pixel circuit included in the display apparatus, the level shifter portion 101A and the pixel circuit can be provided in the same layer as the pixel circuit. Thus, a high-withstand-voltage Si transistor is not necessarily provided separately from the Si transistor included in the logic circuit portion 102A. Thus, the cost of manufacturing the semiconductor device 100A can be reduced.

<Variation Example>

Figure 4:
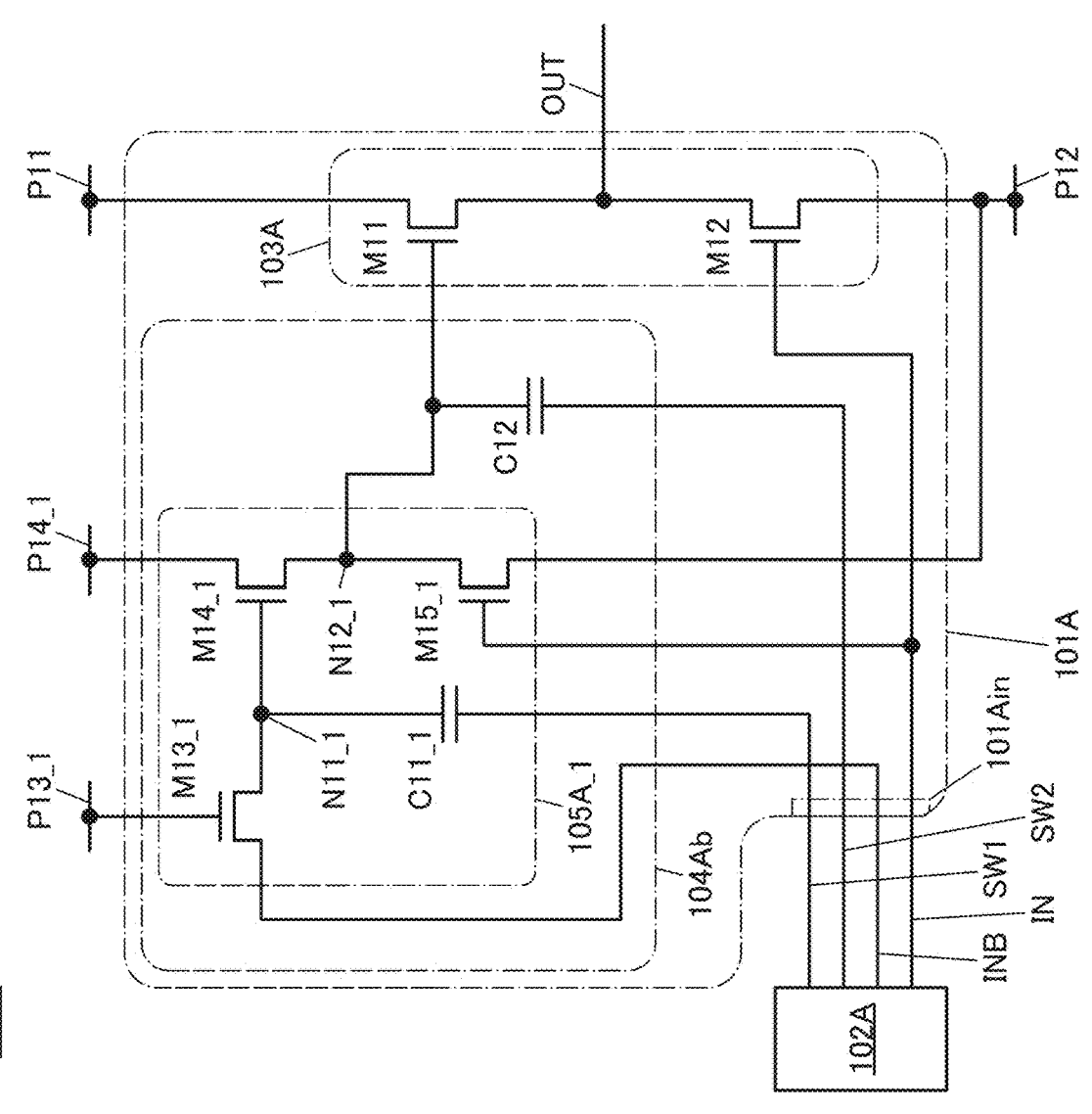
FIG. 4 is a diagram illustrating an example of a semiconductor device.

The semiconductor device 100A of one embodiment of the present invention is not limited to the circuit structure illustrated in FIG. 1. FIG. 4 shows another circuit structure example of the semiconductor device 100A. Note that in order to avoid repeated description, differences of the semiconductor device 100A illustrated in FIG. 4 from the semiconductor device 100A illustrated in FIG. 1 are mainly described. The description of the above structure example can be referred to as appropriate.

The semiconductor device 100A illustrated in FIG. 4 includes a signal booster portion 104Ab instead of the signal booster portion 104Aa included in the semiconductor device 100A illustrated in FIG. 1. The signal booster portion 104Ab includes the booster stage 105A_1 and a capacitor C12.

Although the signal booster portion 104Aa provided with two booster stages (the booster stage 105A_1 and the booster stage 105A_2) is illustrated as a structure example, for example, the signal booster portion 104Aa may include one booster stage or three or more booster stages. The potential can be increased by the potential difference (3 V) of "the potential VDD–the potential VSS" due to capacitive coupling per booster stage. Thus, the number of booster stages is preferably selected appropriately in accordance with the potential desired to be output. The signal booster portion 104Ab includes one booster stage (105A_1).

The other of the source and the drain of the transistor M13_1 is electrically connected to the logic circuit portion 102A through a wiring INB. The gate of the transistor M15_1 is electrically connected to the wiring IN. The gate of the transistor M11 is electrically connected to one of the source and the drain of the transistor M14_1.

One terminal of the capacitor C12 is electrically connected to a gate of the transistor M11, and the other terminal of the capacitor C12 is electrically connected to the wiring SW2. That is, the wiring SW2 and the node N12_1 are capacitively coupled through the capacitor C12. Thus, the capacitor C12 has a function of changing the potential of the node N12_1 in accordance with the signal supplied to the wiring SW2.

Figure 5:
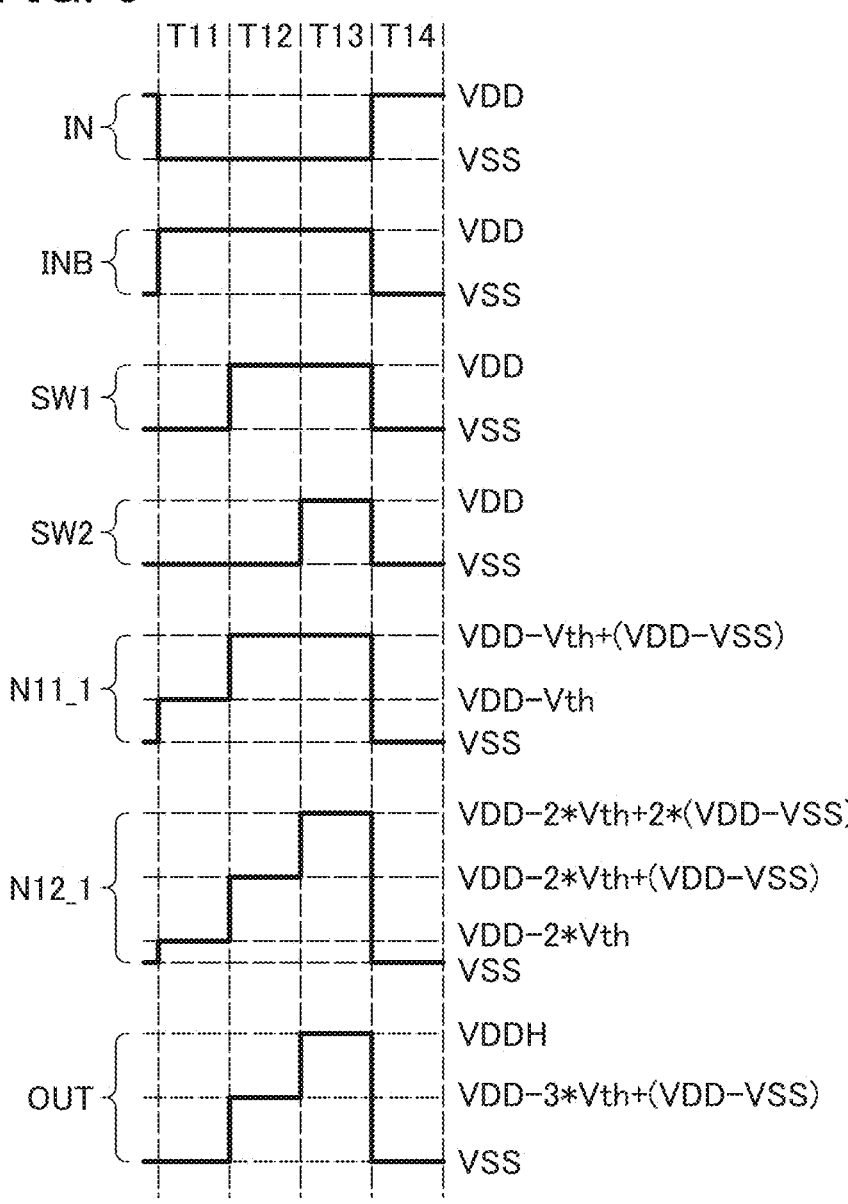
FIG. 5 is a timing chart showing an operation example of a semiconductor device.

FIG. 5 is a timing chart showing the operation example of the semiconductor device 100A illustrated in FIG. 4. In order to avoid repeated description, points different from those in the above-described operation example are mainly described. The description of the above operation example can be referred to as appropriate.

In this embodiment and the like, a logical NOT signal (also referred to as an inverted signal) of the signal supplied to the wiring IN is supplied to the wiring INB. That is, in the case where the potential VDD (3 V) is supplied to the wiring IN, the potential VSS (0 V) is supplied to the wiring INB. Furthermore, in the case where the potential VSS (0 V) is supplied to the wiring IN, the potential VDD (3 V) is supplied to the wiring INB. For example, the potential V13_1 and the potential V14_1 are set at 3 V and 6 V, respectively.

Period T11 to Period T13 are periods in which an operation of outputting the high potential (the potential VDDH) to the wiring OUT is performed. The potential VDD (3 V) is supplied to the wiring INB, and the above operation example can be referred to as appropriate.

Thus, in Period T11, the potentials of the node N11_1, the node N12_1, and the wiring OUT become 2 V, 1 V, and 0 V, respectively. In Period T12, the potentials of the node N11_1, the node N12_1, and the wiring OUT are set at 5 V, 4 V, and 3 V, respectively. In Period T13, the potentials of the node N11_1, the node N12_1, and the wiring OUT are set at 5 V, 7 V, and 6 V, respectively.

Period T14 is a period in which an operation of outputting the low potential (the potential VSS) to the wiring OUT is performed. The potential VDD (3 V) is supplied to the wiring IN, and the potential VSS (0 V) is supplied to the wiring INB, the wiring SW1, and the wiring SW2. This brings the transistor M12, the transistor M13_1, and the transistor M15_1 into an on state. Thus, the potential VSS (0 V) is supplied to the node N11_1, the node N12_1, and the wiring OUT. This brings the transistor M14_1 and the transistor M11 into an off state.

Thus, the potentials of the node N11_1, the node N12_1, and the wiring OUT become 0 V, 0 V, and 0 V, respectively.

In this manner, in the semiconductor device 100A illustrated in FIG. 4, the potential boosted from the potential VDD (3 V) to the potential VDDH (6 V) can be output by performing the operation in Period T11 to Period T13 illustrated in FIG. 5, and the potential VSS (0 V) can be output by performing the operation in Period T14.

At least part of the structure examples, the drawings corresponding thereto, and the like described in this embodiment as an example can be combined with the other structure examples, the other drawings, and the other embodiments described in this specification and the like as appropriate.

Embodiment 2

In this embodiment, a semiconductor device 100B of one embodiment of the present invention is described. The semiconductor device 100B is a variation example of the semiconductor device 100A. Thus, in order to avoid repeated description, differences of the semiconductor device 100B from the semiconductor device 100A are mainly described. The above description of the semiconductor device 100A can be referred to as appropriate.

<Structure Example>

Figure 6:
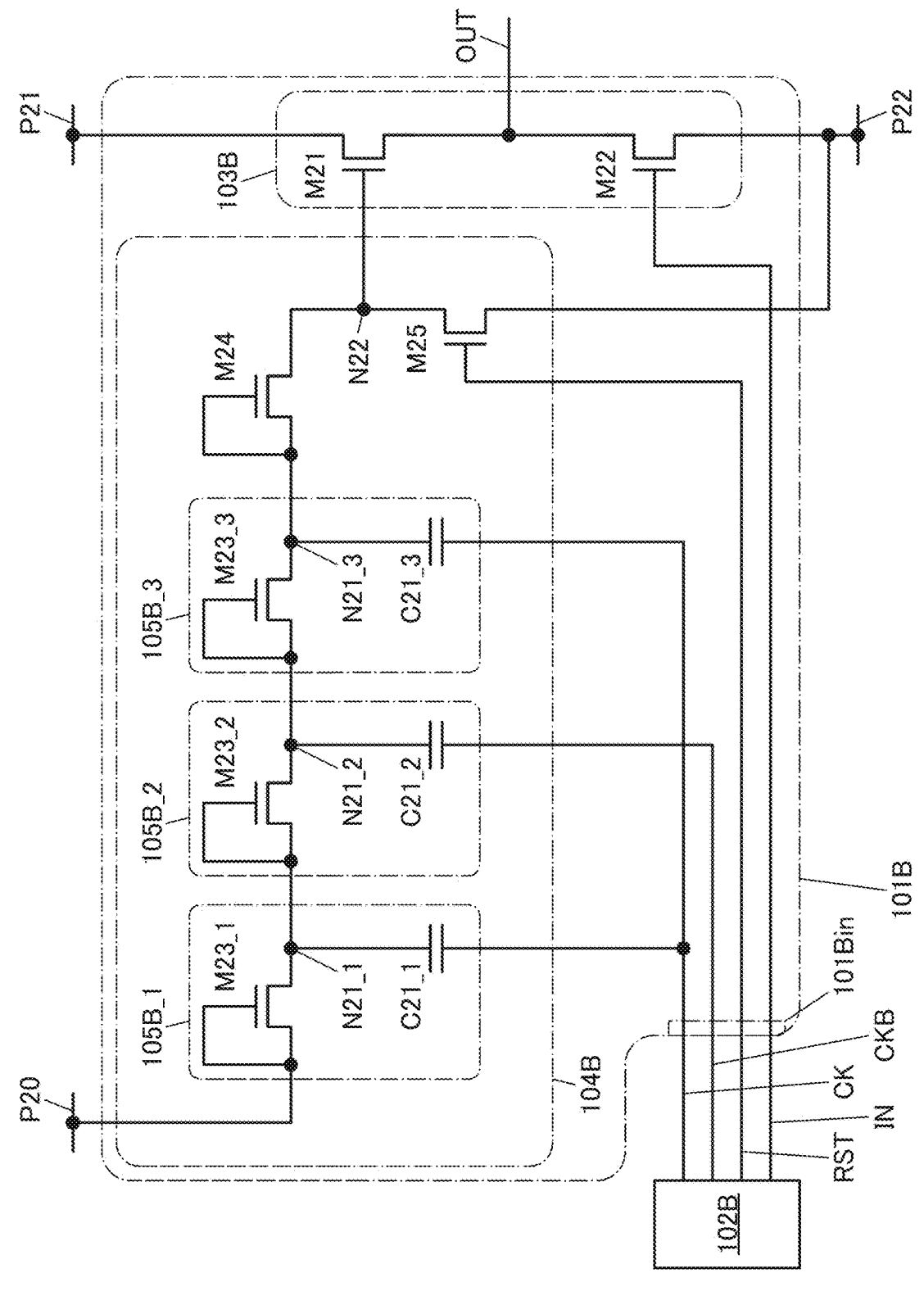
FIG. 6 is a diagram illustrating an example of a semiconductor device.

FIG. 6 illustrates a circuit structure example of the semiconductor device 100B.

The semiconductor device 100B includes a level shifter portion 101B and a logic circuit portion 102B. The level shifter portion 101B includes a plurality of input terminals and at least one output terminal. The logic circuit portion 102B includes a plurality of output terminals. The plurality of input terminals included in the level shifter portion 101B are electrically connected to the plurality of output terminals included in the logic circuit portion 102B.

Specifically, in this embodiment and the like, four input terminals (an input terminal portion 101Bin) included in the level shifter portion 101B are electrically connected to four output terminals of the logic circuit portion 102B through the wiring IN, the wiring RST, a wiring CK, and a wiring CKB. An output terminal included in the level shifter portion 101B is electrically connected to the wiring OUT.

The logic circuit portion 102B has a function of outputting a signal necessary for operating the level shifter portion 101B to each of the wiring IN, the wiring RST, the wiring CK, and the wiring CKB. The level shifter portion 101B has a function of outputting a signal boosted to a potential higher than that of a signal input from each of the wiring IN, the wiring RST, the wiring CK, and the wiring CKB to the wiring OUT using the input signal. That is, the semiconductor device 100B of one embodiment of the present invention has a function of outputting a signal having a larger amplitude than a signal output from the logic circuit portion 102B through the level shifter portion 101B.

The level shifter portion 101B includes a signal booster portion 104B and a signal output portion 103B. The signal booster portion 104B includes a booster stage 105B_1, a booster stage 105B_2, a booster stage 105B_3, a transistor M24, and a transistor M25. The booster stage 105B_1 includes a transistor M23_1 and a capacitor C21_1. The booster stage 105B_2 includes a transistor M23_2 and a capacitor C21_2. The booster stage 105B_3 includes a transistor M23_3 and a capacitor C21_3. The signal output portion 103B includes a transistor M21 and a transistor M22.

The transistor M23_1 is diode-connected. The anode side of the diode-connected transistor M23_1 is electrically connected to the wiring P20, and the cathode side of the diode-connected transistor M23_1 is electrically connected to one terminal of the capacitor C21_1. The other terminal of the capacitor C21_1 is electrically connected to the wiring CK.

The transistor M23_2 is diode-connected. The anode side of the diode-connected transistor M23_2 is electrically connected to the cathode side of the diode-connected transistor M23_1, and the cathode side of the diode-connected transistor M23_2 is electrically connected to one terminal of the capacitor C21_2. The other terminal of the capacitor C21_2 is electrically connected to the wiring CKB.

The transistor M23_3 is diode-connected. The anode side of the diode-connected transistor M23_3 is electrically connected to the cathode side of the diode-connected transistor M23_2, and the cathode side of the diode-connected transistor M23_3 is electrically connected to one terminal of the capacitor C21_3. The other terminal of the capacitor C21_3 is electrically connected to the wiring CK.

The transistor M24 is diode-connected. The anode side of the diode-connected transistor M24 is electrically connected to the cathode side of the diode-connected transistor M23_3, and the cathode side of the diode-connected transistor M24 is electrically connected to one of a source and a drain of the transistor M25.

A gate of the transistor M25 is electrically connected to the wiring RST, and the other of the source and the drain of the transistor M25 is electrically connected to a wiring P22.

A gate of the transistor M21 is electrically connected to the cathode side of the diode-connected transistor M24, one of a source and a drain of the transistor M21 is electrically connected to the wiring OUT, and the other of the source and the drain of the transistor M21 is electrically connected to a wiring P21.

A gate of the transistor M22 is electrically connected to the wiring IN, one of a source and a drain of the transistor M22 is electrically connected to the wiring OUT, and the other of the source and the drain of the transistor M22 is electrically connected to the wiring P22.

Note that a region where the cathode side of the diode-connected transistor M23_1, the one terminal of the capacitor C21_1, and the anode side of the diode-connected transistor M23_2 are electrically connected to each other is also referred to as a node N21_1.

A region where the cathode side of the diode-connected transistor M23_2, the one terminal of the capacitor C21_2, and the anode side of the diode-connected transistor M23_3 are electrically connected to each other is also referred to as a node N21_2.

A region where the cathode side of the diode-connected transistor M23_3, the one terminal of the capacitor C21_3, and the anode side of the diode-connected transistor M24 are electrically connected to each other is also referred to as a node N21_3.

A region where the cathode side of the diode-connected transistor M24, the one of the source and the drain of the transistor M25, and the gate of the transistor M21 are electrically connected to each other is also referred to as a node N22.

Note that the signal booster portion 104B forms a charge pump and has a function of gradually increasing the potential of the node N22 by supply of a clock signal to the wiring CK and the wiring CKB.

In this manner, the level shifter portion 101B included in the semiconductor device 100B of one embodiment of the present invention has a function of increasing the potential by the charge pump in the signal booster portion. Thus, in this specification and the like, a circuit structure like that of the level shifter portion 101B is referred to as a "charge pump type level shifter" in some cases.

As in the semiconductor device 100A, transistors including a variety of semiconductors can be used in the semiconductor device 100B of one embodiment of the present invention. For example, the logic circuit portion 102B is preferably formed using a Si transistor, and the level shifter portion 101B is preferably formed using OS transistors. Thus, in the semiconductor device 100B of one embodiment of the present invention, a signal having a larger amplitude than the signal output from the logic circuit portion 102B can be output through the level shifter portion 101B.

An OS transistor has an extremely low off-state current. Thus, for example, when the OS transistors are used as the transistors included in the level shifter portion 101B, boosted potentials at the nodes (the node N21_1, the node N21_2, the node N21_3, and the node N22) can be retained for a long time.

For example, a layer including the Si transistor (e.g., a layer including the logic circuit portion 102B) and a layer including the OS transistors (e.g., a layer including the level shifter portion 101B) may be provided to overlap with each other. This structure reduces the area occupied by the semiconductor device 100B. Accordingly, the semiconductor device 100B can be downsized.

<Operation Example>

Figure 7:
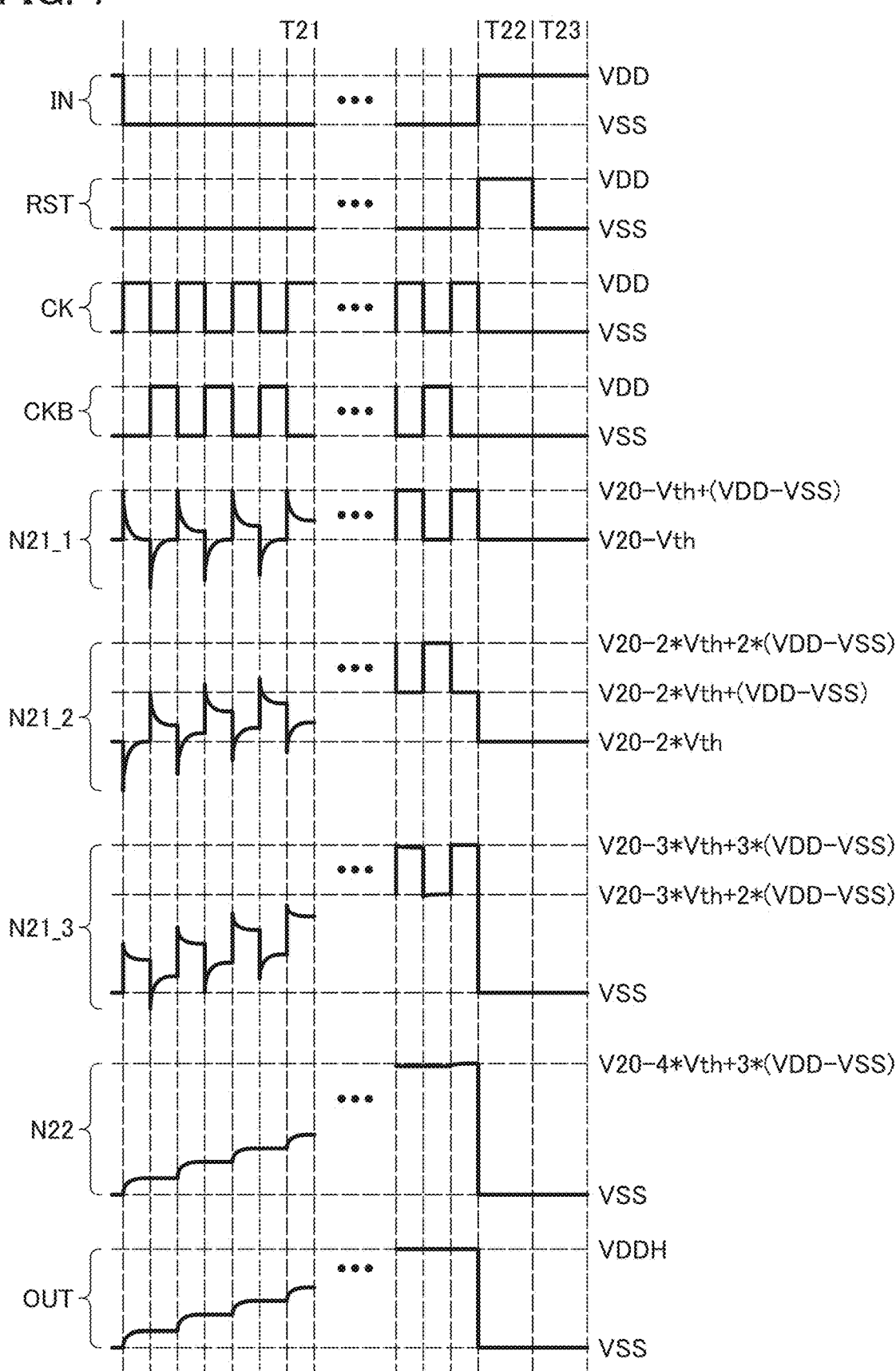
FIG. 7 is a timing chart showing an operation example of a semiconductor device.

Next, an operation example of the semiconductor device 100B is described. FIG. 7 is a timing chart showing the operation example of the semiconductor device 100B.

The logic circuit portion 102B included in the semiconductor device 100B is operated when the potential VSS and the potential VDD are supplied, for example. Thus, the potential of the signal output from the logic circuit portion 102B (the signals supplied to the wiring IN, the wiring RST, the wiring CK, and the wiring CKB) is the potential VSS or the potential VDD. In the case where the Si transistor is used in the logic circuit portion 102B in this embodiment and the like, the potential difference between the potential VDD and the potential VSS (the potential VDD−the potential VSS) is preferably higher than the threshold voltage of the Si transistor and is preferably lower than the withstand voltage of the Si transistor.

The level shifter portion 101B has a function of outputting the potential VDDH or the potential VSS to the wiring OUT on the basis of the signals supplied to the wiring IN, the wiring RST, the wiring CK, and the wiring CKB from the logic circuit portion 102B upon supply of the potential VDDH to the wiring P21, supply of the potential VSS to the wiring P22, and supply of the potential V10 to the wiring P20, for example. Note that in this embodiment and the like, in the case where the OS transistors are used for the level shifter portion 101B, the potential VDDH and the potential V10 may be potentials higher than the potential VDD.

In this embodiment and the like, for example, the potential VSS is set at 0 V and the potential VDD is set at 3 V. As another example, the potential VDDH is set at 6 V. As another example, the potential V10 is set at 3 V. As another example, a threshold voltage Vth of the transistor (e.g., the OS transistor) included in the level shifter portion 101B is set at 1 V.

[High Potential Output]

Period T21 is a period in which an operation of outputting the high potential (the potential VDDH) to the wiring OUT is performed.

In Period T21, the potential VSS (0 V) is supplied to the wiring IN. In addition, the potential VSS (0 V) is supplied to the wiring RST. This brings the transistor M22 into an off state. Furthermore, the transistor M25 is in an off state.

In addition, the potential VDD (3 V) or the potential VSS (0 V) is alternately supplied to the wiring CK at regular intervals. A logical NOT signal (also referred to as the inverted signal) of the signal supplied to the wiring CK is supplied to the wiring CKB. That is, in the case where the potential VDD (3 V) is supplied to the wiring CK, the potential VSS (0 V) is supplied to the wiring CKB. Furthermore, in the case where the potential VSS (0 V) is supplied to the wiring CK, the potential VDD (3 V) is supplied to the wiring CKB.

Since the wiring CK and the node N21_1 are capacitively coupled through the capacitor C21_1 and the wiring CK and the node N21_3 are capacitively coupled through the capacitor C21_3, the potentials of the node N21_1 and the node N21_3 change in accordance with a change in the potential of the wiring CK. Since the wiring CKB and the node N21_2 are capacitively coupled through the capacitor C21_2, the potential of the node N21_2 changes in accordance with a change in the potential of the wiring CKB.

First, right after the potential VDD (3 V) is supplied to the wiring CK and the potential VSS (0 V) is supplied to the wiring CKB, each of the potentials of the node N21_1 and the node N21_3 is increased by the potential difference (3 V) of "the potential VDD–the potential VSS" and the potential of the node N21_2 is lowered by the potential difference (3 V) of "the potential VDD–the potential VSS". At this time, the transistor M23_1 and the transistor M23_3 are brought into an off state and the transistor M23_2 and the transistor M24 are brought into an on state.

Next, right after the potential VSS (0 V) is supplied to the wiring CK and the potential VDD (3 V) is supplied to the wiring CKB, each of the potentials of the node N21_1 and the node N21_3 is lowered by the potential difference (3 V) of "the potential VDD–the potential VSS" and the potential of the node N21_2 is increased by the potential difference (3 V) of "the potential VDD–the potential VSS". At this time, the transistor M23_1 and the transistor M23_3 are brought into an on state and the transistor M23_2 and the transistor M24 are brought into an off state.

In the case where these operations are alternately repeated, the potential of the node N22 is increased gradually, and the potential of the node N22 becomes 8 V in the end. This brings the transistor M21 into an on state, and the potential of the wiring OUT becomes 6 V.

Note that the time required for boosting the charge pump type level shifter (the level shifter portion 101B) provided in the semiconductor device 100B of one embodiment of the present invention is longer than that of the above-described capacitive coupling type level shifter (the level shifter portion 101A). Thus, a sufficient period is preferably provided for Period T21.

[Low Potential Output]

Period T22 and Period T23 are periods in which an operation of outputting the low potential (the potential VSS) to the wiring OUT is performed.

First, in Period T22, the potential VDD (3 V) is supplied to each of the wiring IN and the wiring RST, and the potential VSS (0 V) is supplied to each of the wiring CK and the wiring CKB. This brings the transistor M22 and the transistor M25 into an on state. Thus, the potential VSS (0 V) is supplied to the node N22 and the wiring OUT. This brings the transistor M21 into an off state.

Note that the potential of the wiring P20 is a potential V20, that is, 3 V. Thus, each of the transistor M23_1, the transistor M23_2, the transistor M23_3, and the transistor M24 is brought into an off state, and the current flows from the wiring P20 to the wiring P22 through the transistor M23_1, the transistor M23_2, the transistor M23_3, the transistor M24, and the transistor M25. Thus, Period T22 is preferably short in time, and when the transistor M21 is brought into an off state, the operation in the next Period T23 is preferably performed.

Next, in Period T23, the potential VSS (0 V) is supplied to the wiring RST. The potential VDD (3 V) is supplied to the wiring IN. This brings the transistor M25 into an off state. In addition, the transistor M22 is in an on state. Accordingly, the potential of the wiring OUT is maintained at the potential VSS (0 V).

In this manner, in the semiconductor device 100B of one embodiment of the present invention, the potential boosted from the potential VDD (3 V) to the potential VDDH (6 V) can be output by performing the operation in Period T21, and the potential VSS (0 V) can be output by performing the operation in Period T22 and Period T23.

Thus, in the semiconductor device 100B of one embodiment of the present invention, with the use of the Si transistor as the transistor included in the logic circuit portion 102B, and the OS transistor having a higher withstand voltage than the Si transistor as the transistor included in the level shifter portion 101B, a signal whose potential is boosted to a potential higher than the withstand voltage of the Si transistor can be output.

Note that the charge pump type level shifter (the level shifter portion 101B) in the semiconductor device 100B of one embodiment of the present invention has a smaller number of wirings for supplying potentials than the capacitive coupling type level shifter (the level shifter portion 101A) described above. When the potential supplied to the wiring P20 is set at the potential VDD, for example, the level shifter portion 101B can share a power source with the logic circuit portion 102B. Accordingly, the number of power sources for operating the semiconductor device can be reduced.

The semiconductor device 100B of one embodiment of the present invention is not limited to the circuit structure illustrated in FIG. 6. Although the semiconductor device 100B illustrated in FIG. 6 has a structure example including three booster stages (105B_1, 105B_2, and 105B_3), for example, a structure including two or less booster stages may be employed or a structure including four or more booster stages may be employed. The potential can be increased by "(the potential VDD–the potential VSS)–the threshold voltage Vth", i.e., 2 V per booster stage. Thus, the number of booster stages is preferably selected appropriately in accordance with the potential desired to be output. Note that in the case where the number of booster stages is increased, for example, the wiring CK is electrically connected to each of the capacitors in odd-numbered stages, and the wiring CKB is electrically connected to each of the capacitors in even-numbered stages; thus, the number of signals output from the logic circuit portion does not need to be increased.

<Variation Example>

Figure 8:
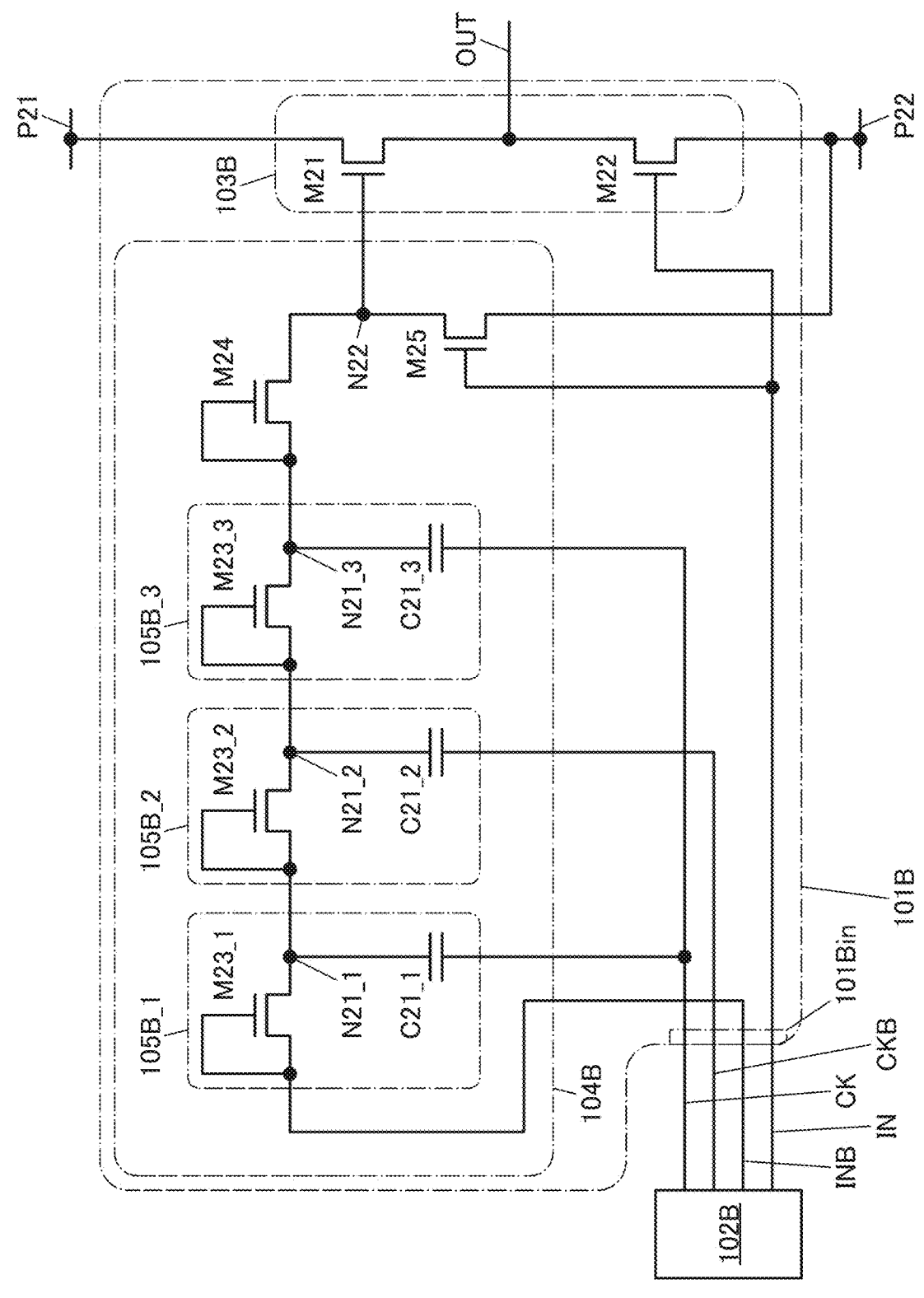
FIG. 8 is a diagram illustrating an example of a semiconductor device.

FIG. 8 shows another structure example of the semiconductor device 100B. Note that in order to avoid repeated description, differences of the semiconductor device 100B illustrated in FIG. 6 from the semiconductor device 100B illustrated in FIG. 8 are mainly described. The description of the above structure example can be referred to as appropriate.

In the semiconductor device 100B illustrated in FIG. 8, the anode side of the diode-connected transistor M23_1 is electrically connected to the logic circuit portion 102B through the wiring INB. The gate of the transistor M25 is electrically connected to the wiring IN.

Figure 9:
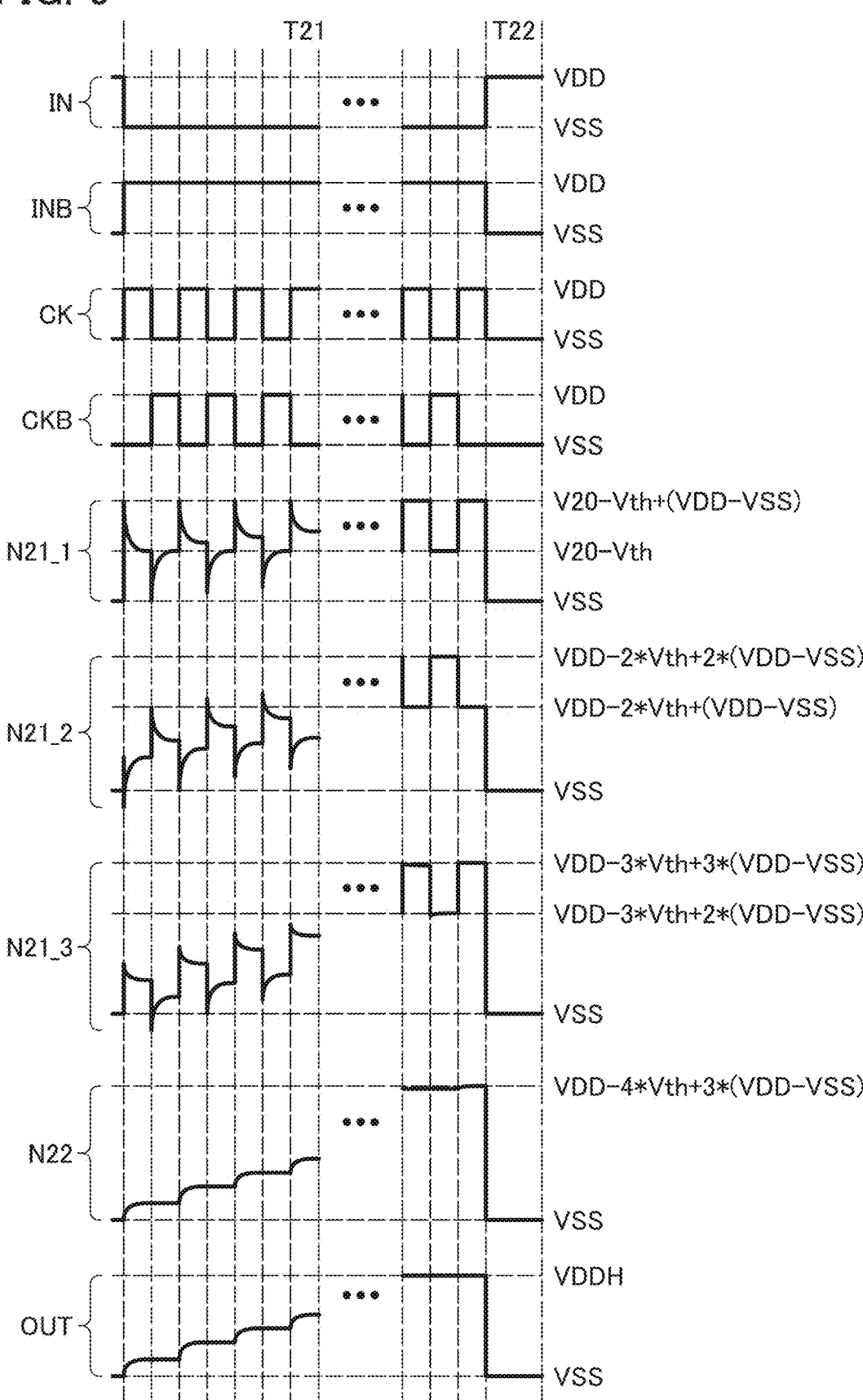
FIG. 9 is a timing chart showing an operation example of a semiconductor device.

FIG. 9 is a timing chart showing the operation example of the semiconductor device 100B illustrated in FIG. 8. In order to avoid repeated description, points different from those in the above-described operation example are mainly described. The description of the above operation example can be referred to as appropriate.

In this embodiment and the like, a logical NOT signal (also referred to as the inverted signal) of the signal supplied to the wiring IN is supplied to the wiring INB. That is, in the case where the potential VDD (3 V) is supplied to the wiring IN, the potential VSS (0 V) is supplied to the wiring INB. Furthermore, in the case where the potential VSS (0 V) is supplied to the wiring IN, the potential VDD (3 V) is supplied to the wiring INB.

Period T21 is a period in which an operation of outputting the high potential (the potential VDDH) to the wiring OUT is performed. The potential VDD (3 V) is supplied to the wiring INB, and the above operation example can be referred to as appropriate.

Thus, in Period T21, the potential of the node N22 is increased gradually, and the potential of the node N22 becomes 8 V in the end. This brings the transistor M21 into an on state, and the potential of the wiring OUT becomes 6 V.

Period T22 is a period in which an operation of outputting the low potential (the potential VSS) to the wiring OUT is performed. The potential VDD (3 V) is supplied to the wiring IN, and the potential VSS (0 V) is supplied to each of the wiring INB, the wiring SW1, and the wiring SW2. This brings the transistor M22 and the transistor M25 into an on state. Thus, the potential of the wiring OUT becomes the potential VSS (0 V).

In this manner, in the semiconductor device 100B illustrated in FIG. 8, the potential boosted from the potential VDD (3 V) to the potential VDDH (6 V) can be output when the operation in Period T21 illustrated in FIG. 9 is performed, and the potential VSS (0 V) can be output when the operation in Period T22 is performed.

At least part of the structure examples, the drawings corresponding thereto, and the like described in this embodiment as an example can be combined with the other structure examples, the other drawings, and the other embodiments described in this specification and the like as appropriate.

Embodiment 3

Figure 10:
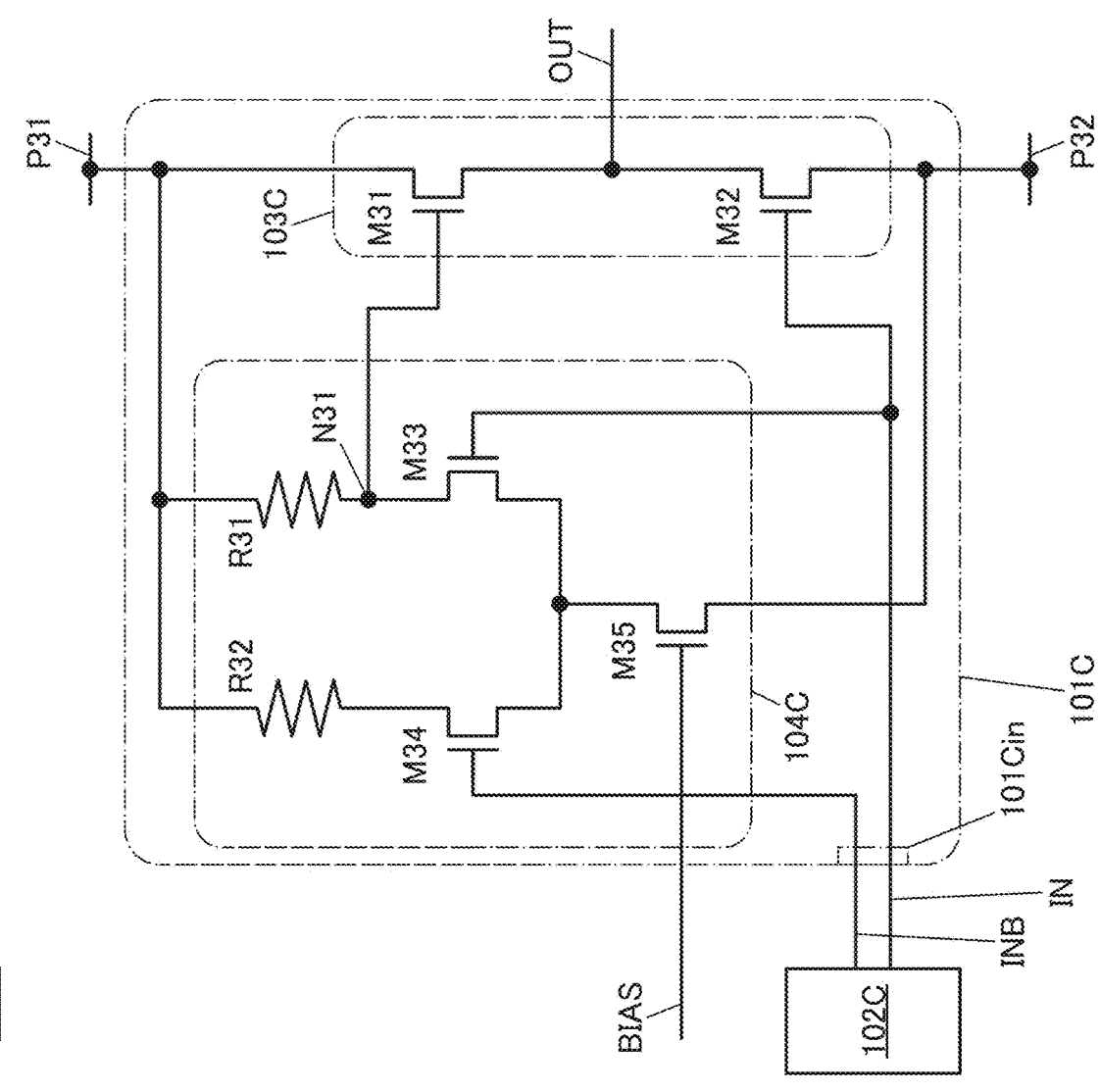
FIG. 10 is a diagram illustrating an example of a semiconductor device.

In this embodiment, a semiconductor device 100C of one embodiment of the present invention is described. The semiconductor device 100C is a variation example of the semiconductor device 100A. Thus, in order to reduce repeated description, differences of the semiconductor device 100C from the semiconductor device 100A are mainly described.
<Structure Example>
FIG. 10 illustrates a circuit structure example of the semiconductor device 100C.

The semiconductor device 100C includes a level shifter portion 101C and a logic circuit portion 102C. The level shifter portion 101C includes a plurality of input terminals and at least one output terminal. The logic circuit portion 102C includes a plurality of output terminals. The plurality of input terminals included in the level shifter portion 101C are electrically connected to the plurality of output terminals included in the logic circuit portion 102C.

Specifically, in this embodiment and the like, two input terminals (an input terminal portion 101Cin) included in the level shifter portion 101C are electrically connected to two output terminals of the logic circuit portion 102C through the wiring IN and the wiring INB. An output terminal included in the level shifter portion 101C is electrically connected to the wiring OUT.

The logic circuit portion 102C has a function of outputting a signal necessary for operating the level shifter portion 101C to each of the wiring IN and the wiring INB. The level shifter portion 101C has a function of outputting a signal boosted to a potential higher than that of a signal input from each of the wiring IN and the wiring INB to the wiring OUT using the input signal. That is, the semiconductor device 100C of one embodiment of the present invention has a function of outputting a signal having a larger amplitude than a signal output from the logic circuit portion 102C through the level shifter portion 101C.

The level shifter portion 101C includes a signal booster portion 104C and a signal output portion 103C. The signal booster portion 104C includes a transistor M33, a transistor M34, a transistor M35, a resistor R31, and a resistor R32. The signal output portion 103C includes a transistor M31 and a transistor M32.

The gate of the transistor M33 is electrically connected to the wiring IN, one of a source and a drain of the transistor M33 is electrically connected to one terminal of the resistor R31, and the other of the source and the drain of the transistor M33 is electrically connected to one of a source and a drain of the transistor M35. The other terminal of the resistor R31 is electrically connected to a wiring P31.

A gate of the transistor M34 is electrically connected to the wiring INB, one of a source and a drain of the transistor M34 is electrically connected to one terminal of the resistor R32, and the other of the source and the drain of the transistor M34 is electrically connected to the one of the source and the drain of the transistor M35. The other terminal of the resistor R32 is electrically connected to the wiring P31.

A gate of the transistor M35 is electrically connected to a wiring BIAS, and the other of the source and the drain of the transistor M35 is electrically connected to a wiring P32.

A gate of the transistor M31 is electrically connected to the one of the source and the drain of the transistor M33, one of a source and a drain of the transistor M31 is electrically connected to a wiring OUT, and the other of the source and the drain of the transistor M31 is electrically connected to the wiring P31.

A gate of the transistor M32 is electrically connected to the wiring IN, one of a source and a drain of the transistor M32 is electrically connected to the wiring OUT, and the other of the source and the drain of the transistor M32 is electrically connected to the wiring P32.

Note that a region where the one of the source and the drain of the transistor M33, the one terminal of the resistor R31, and the gate of the transistor M31 are electrically connected to each other is also referred to as a node N31.

Note that in this embodiment and the like, the resistor R31 and the resistor R32 of the semiconductor device 100C may each be replaced with a diode-connected transistor. In that case, the anode side of the diode-connected transistor is preferably electrically connected to the wiring P31.

Note that the signal booster portion 104C forms a comparator and has a function of changing the potential of the node N31 by comparing the signals supplied to the wiring IN and the wiring INB.

As described above, the level shifter portion 101C included in the semiconductor device 100C of one embodiment of the present invention has a function of changing the potential as a result of comparison using a comparator in the signal booster portion. Thus, in this specification and the like, a circuit structure like that of the level shifter portion 101C is referred to as a "comparator type level shifter" in some cases.

As in the semiconductor device 100A, transistors including a variety of semiconductors can be used in the semiconductor device 100C of one embodiment of the present invention. For example, the logic circuit portion 102C is preferably formed using a Si transistor, and the level shifter portion 101C is preferably formed using OS transistors. Thus, in the semiconductor device 100C of one embodiment of the present invention, a signal having a larger amplitude than the signal output from the logic circuit portion 102C can be output through the level shifter portion 101C.

Moreover, for example, a layer including the Si transistor (e.g., a layer including the logic circuit portion 102C) and a layer including the OS transistors (e.g., a layer including the level shifter portion 101C) may be provided to overlap with each other. This structure reduces the area occupied by the semiconductor device 100C. Accordingly, the semiconductor device 100C can be downsized.

<Operation Example>

Figure 11:
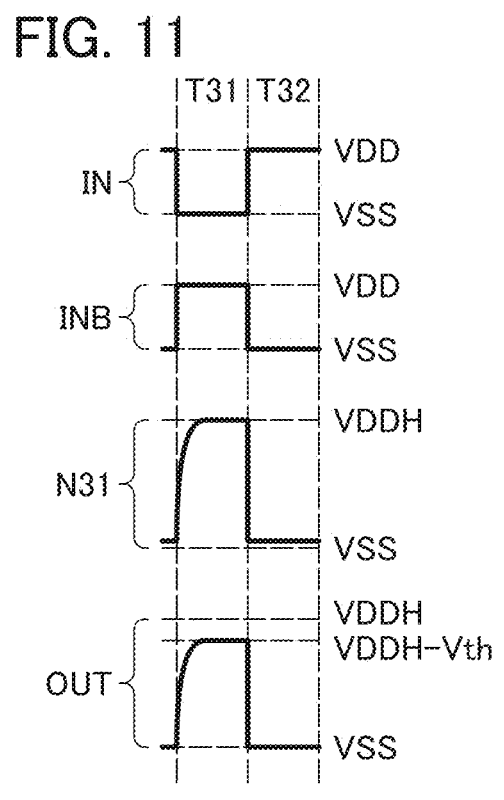

Next, an operation example of the semiconductor device 100C is described. FIG. 11 is a timing chart showing the operation example of the semiconductor device 100C.

The logic circuit portion 102C included in the semiconductor device 100C is operated when the potential VSS and the potential VDD are supplied, for example. Thus, the potential of the signal output from the logic circuit portion 102C (the signals supplied to the wiring IN and the wiring INB) is the potential VSS or the potential VDD. In the case where the Si transistor is used in the logic circuit portion 102C in this embodiment and the like, the potential difference between the potential VDD and the potential VSS (the potential VDD–the potential VSS) is preferably higher than the threshold voltage of the Si transistor and is preferably lower than the withstand voltage of the Si transistor.

The level shifter portion 101C has a function of outputting the potential VDDH or the potential VSS to the wiring OUT on the basis of the signals supplied from the logic circuit portion 102C to the wiring IN and the wiring INB upon supply of the potential VDDH to the wiring P31 and supply of the potential VSS to the wiring P32, for example. Note that in this embodiment and the like, in the case where the OS transistors are used in the level shifter portion 101C, the potential VDDH may be a potential higher than the potential VDD.

The transistor M35 has a function of making a constant current flow between the source and the drain upon supply of a constant potential to the wiring BIAS. Thus, the potential supplied to the wiring BIAS is preferably a potential at which the transistor M35 operates in a saturation region.

In this embodiment and the like, for example, the potential VSS is set at 0 V and the potential VDD is set at 3 V. As another example, the potential VDDH is set at 6 V. For example, a threshold voltage Vth of the transistor (e.g., the OS transistor) included in the level shifter portion 101C is set at 1 V.

[High Potential Output]

Period T31 is a period in which an operation of outputting the high potential (the potential VDDH) to the wiring OUT is performed.

In Period T31, the potential VSS (0 V) is supplied to the wiring IN and the potential VDD (3 V) is supplied to the wiring INB. This brings the transistor M32 and the transistor M33 into an off state and the transistor M34 into an on state.

Thus, the potential VDDH is supplied to the node N31, so that the transistor M31 is turned on. Thus, the potential of the wiring OUT becomes "the potential VDDH–the threshold voltage Vth", that is, 5 V.

[Low Potential Output]

Period T32 is a period in which an operation of outputting the low potential (the potential VSS) to the wiring OUT is performed.

In Period T32, the potential VDD (3 V) is supplied to the wiring IN, and the potential VSS (0 V) is supplied to the wiring INB. This brings the transistor M32 and the transistor M33 into an on state and the transistor M34 into an off state.

Thus, the potential of the node N31 is decreased which brings the transistor M31 into an off state. Thus, the potential of the wiring OUT becomes the potential VSS (0 V).

As described above, in the semiconductor device 100C of one embodiment of the present invention, the potential boosted from the potential VDD (3 V) to "the potential VDDH–the threshold voltage Vth" (5 V) can be output by performing the operation in Period T31, and the potential VSS (0 V) can be output by performing the operation in Period T32.

Thus, in the semiconductor device 100C of one embodiment of the present invention, with the use of the Si transistor as the transistor included in the logic circuit portion 102C and the OS transistor having a higher withstand voltage than the Si transistor as the transistor included in the level shifter portion 101C, a signal whose potential is boosted to a potential higher than the withstand voltage of the Si transistor can be output.

Note that the time required for boosting the comparator type level shifter (the level shifter portion 101C) included in the semiconductor device 100C of one embodiment of the present invention is shorter than that of the above-described capacitive coupling level shifter (the level shifter portion 101A). Since the number of signals needed for boosting is small in the level shifter portion 101C, the configuration of the logic circuit portion 102C can be simplified. Thus, the semiconductor device can be driven at high speed.

At least part of the structure examples described in this embodiment as examples, the drawings corresponding thereto, and the like can be combined with the other structure examples, the other drawings, and the other embodiments described in this specification and the like as appropriate.

Embodiment 4

In this embodiment, a structure example of a display apparatus including a semiconductor device of one embodiment of the present invention is described.

Structure Example 1

Figure 12A:
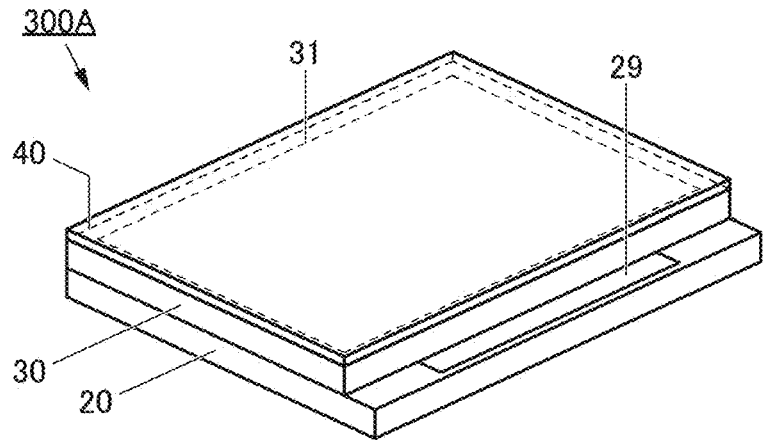
FIG. 12A and FIG. 12B are diagrams each illustrating a structure example of a display apparatus.
Figure 12B:
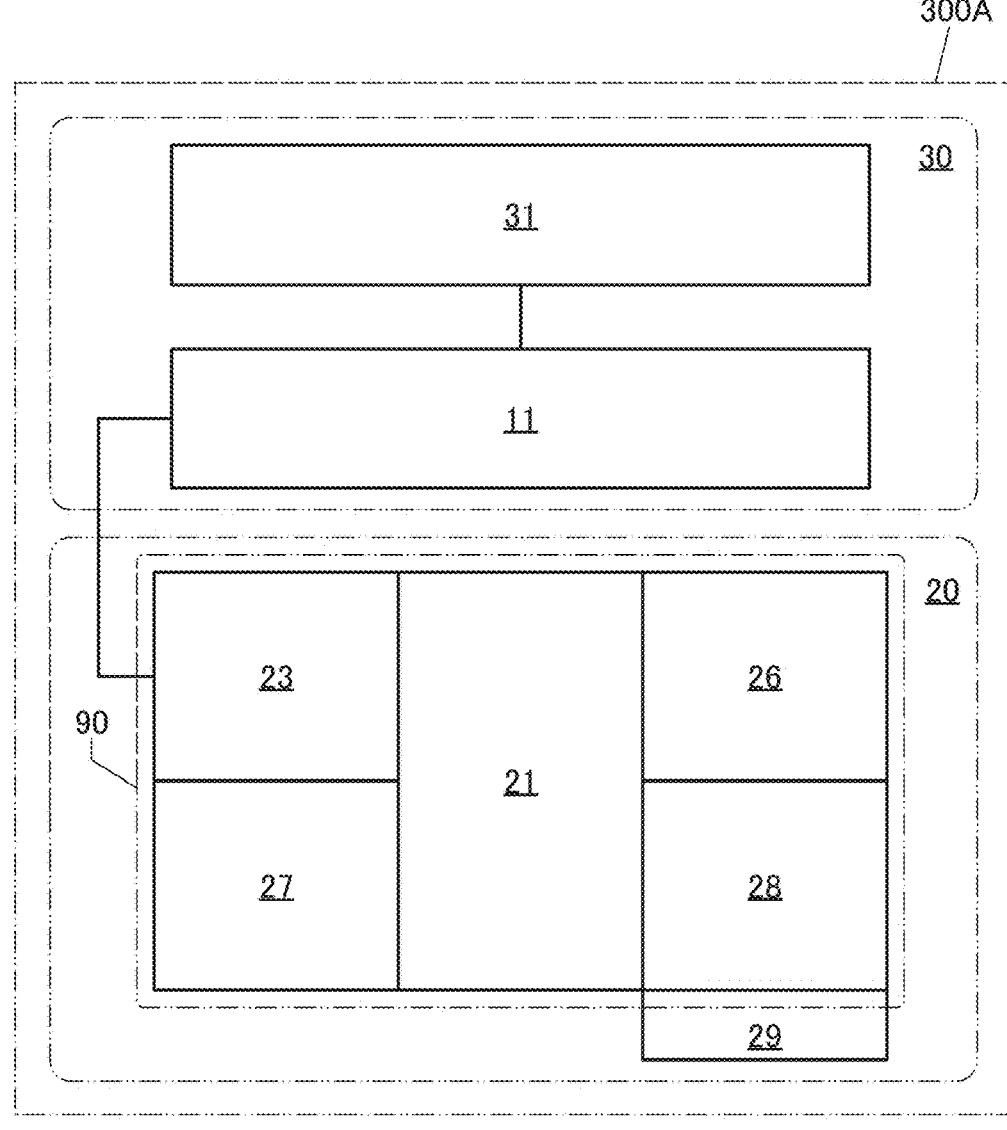
Figure 13:
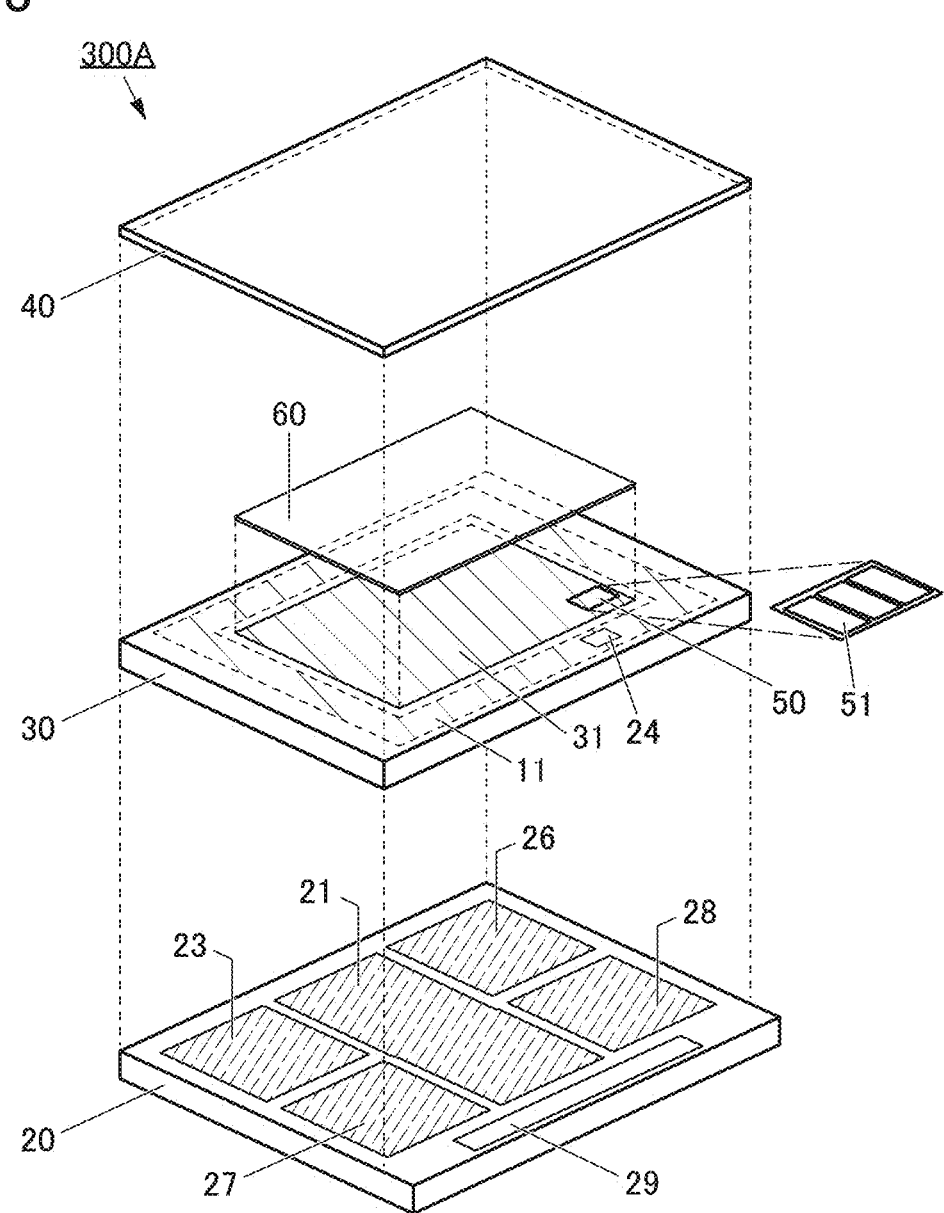
FIG. 13 is a diagram illustrating a structure example of a display apparatus.

FIG. 12A and FIG. 13 are perspective views of a display apparatus 300A of one embodiment of the present invention. FIG. 12B is a block diagram illustrating a structure of the display apparatus 300A. The display apparatus 300A includes a layer 30 over a layer 20 and a sealing substrate 40 over the layer 30. The layer 30 includes a driving portion 11 and a display portion 31, and the driving portion 11 includes a driving signal output circuit 24. A layer 60 is provided between the sealing substrate 40 and the display portion 31.

A structure in which the driving portion 11 is provided in a peripheral portion of a region where the display portion 31 is provided in the layer 30 is illustrated as an example. In FIG. 13, in order to elucidate the structure of the display apparatus 300A, for example, the layer 20, the layer 30, the layer 60, the sealing substrate 40, and the like are illustrated separately.

The layer 20 includes a functional circuit 90 and a terminal portion 29. The functional circuit 90 includes a control circuit 21, a driving signal generation circuit 23, a sensor circuit 26, a communication circuit 27, and an input/output circuit 28.

Note that the functional circuit 90 does not necessarily include all of the components, and may include another component. For example, at least one of a power supply circuit and a power management circuit or the like controlling power supply may be included. For example, at least one of a DSP (Digital Signal Processor), an FPGA (Field Programmable Gate Array), or the like may be included. For example, a super-definition circuit or the like may be included. The super-definition circuit has a function of upconverting image data with a lower definition than that of the display portion. The super-definition circuit has a function of downconverting image data with a higher definition than that of the display portion.

Note that the functional circuit 90 is preferably formed using a Si CMOS, i.e., transistors including silicon in their channel formation regions (Si transistors). That is, the layer 20 including the functional circuit 90 is a layer including the Si transistors. When the functional circuit 90 is configured with the Si transistors, circuits having functions of the control circuit 21, the driving signal generation circuit 23, the sensor circuit 26, the communication circuit 27, the input/output circuit 28, and the like can be provided in the functional circuit 90.

For the Si transistors, for example, it is particularly preferable to use silicon with high crystallinity, such as single crystal silicon or polycrystalline silicon, in order to achieve high field-effect mobility and perform higher-speed operation.

The layer 30 is a layer including the OS transistors, that is, transistors including an oxide semiconductor in their channel formation regions. With this structure, the driving signal output circuit 24 and the display portion 31 including the OS transistors can be stacked over the layer 20.

An OS transistor has a characteristic of an extremely low off-state current. Thus, for example, when the OS transistor is used as a transistor provided in a pixel circuit, analog data written to the pixel circuit can be retained for a long period.

Moreover, the OS transistor has a higher source-drain withstand voltage than the Si transistor. Thus, with the use of the OS transistor as the transistor included in the level shifter, for example, a signal boosted to a potential higher than the withstand voltage of the Si transistor can be obtained. Thus, for example, voltage required for driving the OS transistor provided in the pixel circuit can be obtained.

When the Si transistor is used as the functional circuit 90, the functional circuit 90 can operate with a voltage lower than a voltage needed for driving the OS transistor provided in a pixel circuit 51 included in the display portion 31, for example. Thus, power consumption of the display apparatus can be reduced.

When the functional circuit 90 has a function of upconverting or downconverting image data, image processing performed in an external circuit can be performed in the display apparatus; thus, the image processing can be performed in a distributed manner.

The control circuit 21 has a function of controlling the operation of the functional circuit 90 provided in the layer 20 on the basis of signals from processing circuits of image data such as a CPU (Central Processing Unit) or a GPU (Graphics Processing Unit).

The driving portion 11 may include a circuit functioning as a scan line driver circuit (a gate line driver circuit) of the pixel circuit 51 included in the display portion 31, for example. The driving portion 11 may include a circuit functioning as a signal line driver circuit (a source line driver circuit) of the pixel circuit 51 included in the display portion 31, for example. The driving portion 11 is electrically connected to the driving signal generation circuit 23 and the display portion 31 and has a function of supplying image data to the display portion 31 on the basis of the signal supplied from the driving signal generation circuit 23. For example, at least one of a variety of circuits such as a shift register, an inverter, a latch, a level shifter, a buffer, an analog switch, an operational amplifier, and a D/A converter can be used in the driving portion 11.

The driving portion 11 may include the driving signal output circuit 24 in part of each of the circuit functioning as a scan line driver circuit and the circuit functioning as a signal line driver circuit. The driving signal output circuit 24 has a function of outputting a signal boosted to a potential higher than that of a signal input from the driving signal generation circuit 23 using the input signal. For example, at least one of a variety of circuits such as a shift register, an inverter, a latch, and a logic circuit can be used as the driving signal generation circuit 23. For example, at least one of a variety of circuits such as a level shifter and a buffer can be used as the driving signal output circuit 24.

Note that in this embodiment and the like, the driving signal generation circuit 23 and the driving signal output circuit 24 are collectively referred to as "display portion driver circuit" in some cases. The semiconductor device 100A described in Embodiment 1, the semiconductor device 100B described in Embodiment 2, or the semiconductor device 100C described in Embodiment 3 can be used for the display portion driver circuit, for example. For example, in the case where the semiconductor device 100A is used in the display portion driver circuit, the logic circuit portion 102A can be used as the driving signal generation circuit 23 and the level shifter portion 101A can be used as the driving signal output circuit 24.

In the structure illustrated in FIG. 13, the driving portion 11 is provided in the peripheral portion of the region where the display portion 31 is provided. Note that the driving portion 11 may be provided in at least part of a region of the peripheral portion of the display portion 31. With this structure, the driving portion 11 can be placed to fill a region where the display portion 31 is not provided in the layer 30. Thus, the driving portion 11 can be placed without reducing the display quality, e.g., without narrowing the area of the display portion 31.

The layer 60 is provided to overlap with the display portion 31 included in the layer 30. The layer 60 includes a plurality of light-emitting elements, and the emission luminance is controlled by the pixel circuit 51 provided in the display portion 31. Thus, the layer 60 can also be regarded as part of the display portion 31.

The display portion 31 includes a pixel 50 including a plurality of the pixel circuits 51. The pixel 50 includes the pixel circuits 51 and a light-emitting element (not illustrated) provided in the layer 60 over the pixel circuits 51. The pixel circuits 51 correspond to pixel circuits included in sub-pixels for performing color display.

Note that three sub-pixels control the emission amounts or the like of red light, green light, and blue light. The light colors controlled by the three subpixels are not limited to a combination of red (R), green (G), and blue (B) and may be a combination of cyan (C), magenta (M), and yellow (Y). In addition, each of the three subpixels do not necessarily have the same area. For example, in the case where luminous efficiency, reliability, or the like varies depending on the emission color, the subpixel area may be changed depending on the emission color. Four subpixels may collectively function as one pixel. For example, a subpixel that controls the emission amount of white light may be added to the three subpixels that control the emission amounts of red light, green light, and blue light. The addition of the subpixel that controls the emission amount of white light can increase the luminance of a display region. Alternatively, a subpixel that controls the emission amount of yellow light may be added to the three subpixels that control the emission amounts of red light, green light, and blue light. Alternatively, a subpixel that controls the emission amount of white light may be added to the three subpixels that control the emission amounts of cyan light, magenta light, and yellow light.

When the number of subpixels functioning as one pixel is increased and a subpixel that controls the emission amount of light of red, green, blue, cyan, magenta, yellow, or the like is used appropriately in combination, the reproducibility of halftones can be increased. Thus, color reproducibility can be increased.

The sensor circuit 26 has a function of obtaining information on one or more of the senses of sight, hearing, touch, taste, and smell of a human, for example. Specifically, for example, the sensor circuit 26 has a function of sensing or measuring one or more of the following: force, displacement, position, speed, acceleration, angular velocity, rotational frequency, distance, light, magnetism, temperature, sound, time, electric field, current, voltage, electric power, radiation, humidity, gradient, oscillation, smell, and infrared rays. The sensor circuit 26 may have a function other than those functions.

The communication circuit 27 has a function of communicating with other terminals by wire or wirelessly. In particular, the communication circuit 27 preferably has a wireless communication function, in which case the number of parts such as a connection cable can be decreased.

The input/output circuit 28 has a function of distributing signals supplied to the display apparatus 300A through the terminal portion 29, to circuits such as the control circuit 21, for example. The input/output circuit 28 also has a function of distributing a signal supplied to the display apparatus 300A through the communication circuit 27 to circuits such as the control circuit 21, for example. The input/output circuit 28 has a function of outputting signals to the outside through the terminal portion 29. The input/output circuit 28 has function of outputting signals to the outside through the communication circuit 27.

An FPC (Flexible Printed Circuits) or the like is electrically connected to the terminal portion 29, for example. Thus, the layer 30 and the sealing substrate 40 are not formed in a region overlapping with the terminal portion 29.

Structure Example 2

Figure 14A:
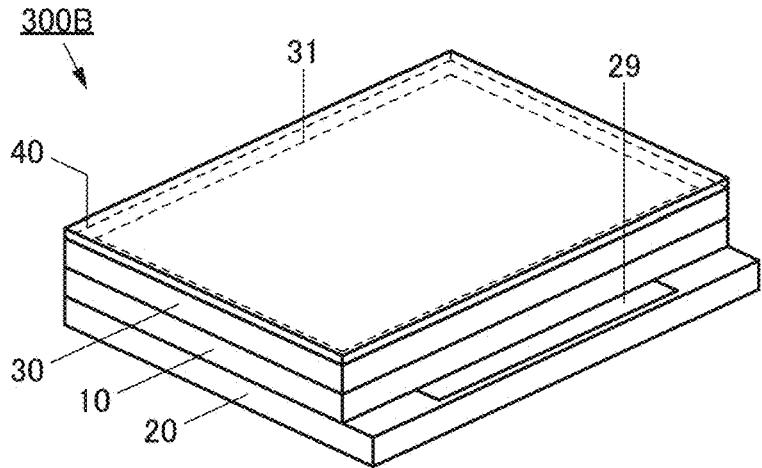
FIG. 14A and FIG. 14B are diagrams each illustrating a structure example of a display apparatus.
Figure 14B:
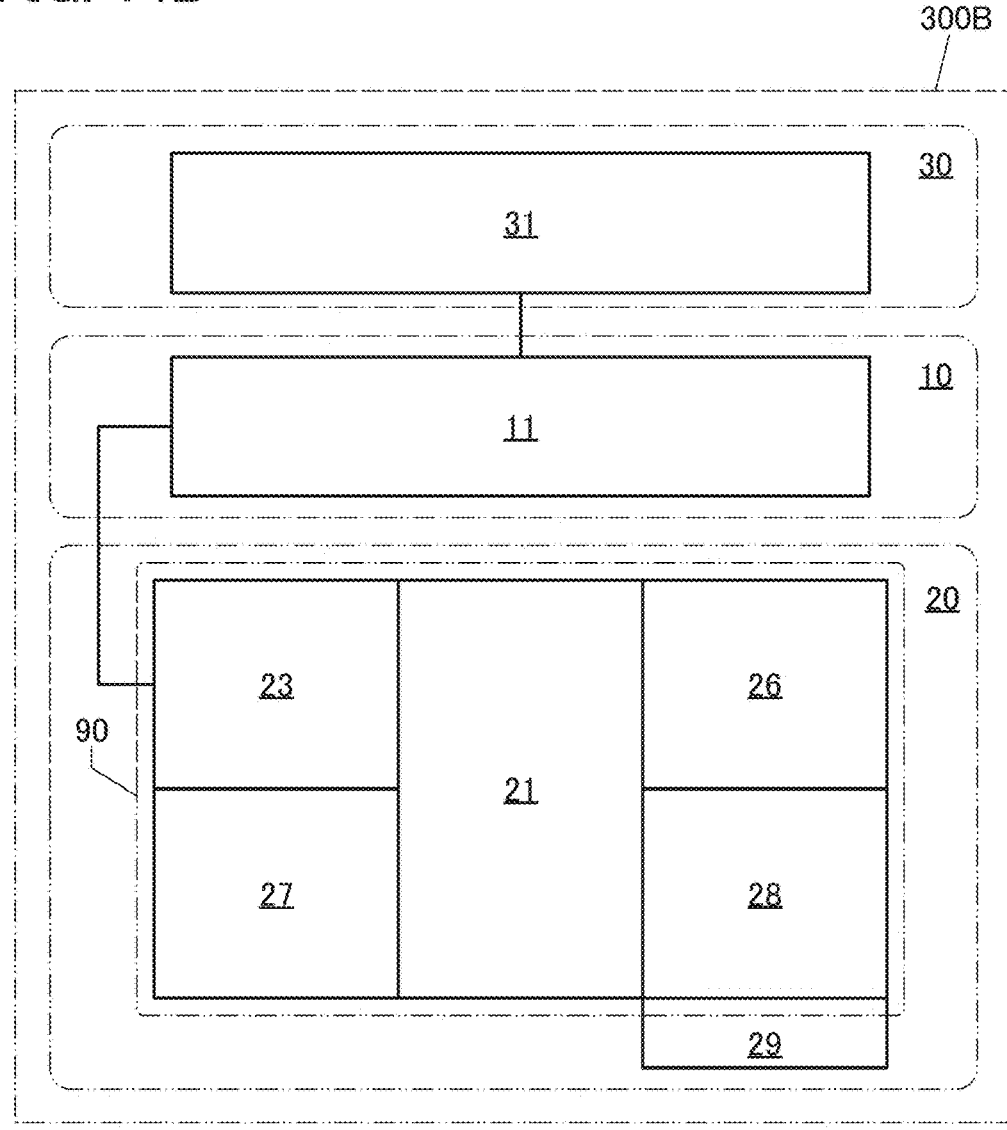
Figure 15:
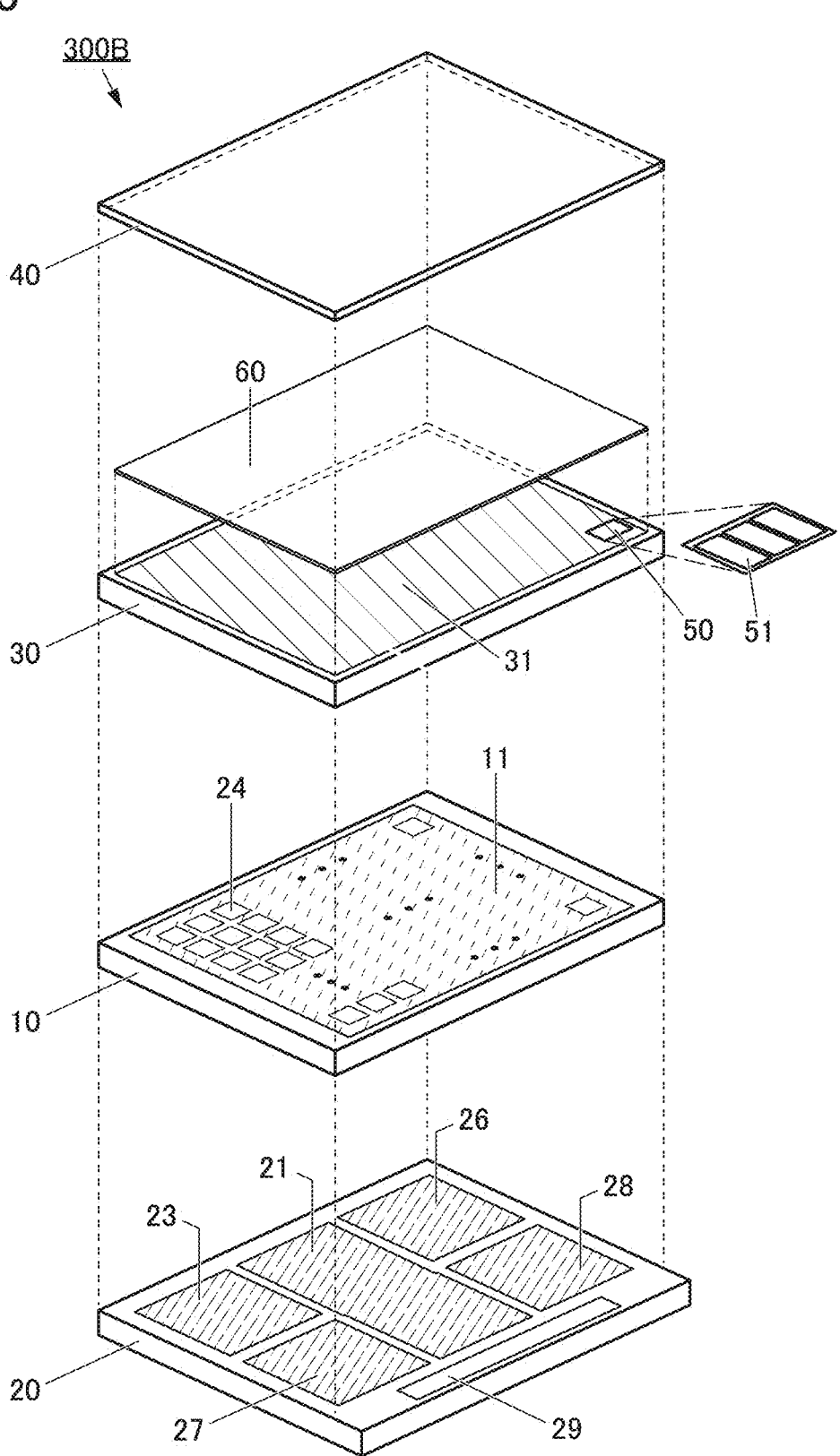
FIG. 15 is a diagram illustrating a structure example of a display apparatus.

Another structure examples of the display apparatus according to one embodiment of the present invention will be described. FIG. 14A and FIG. 15 are perspective views of a display apparatus 300B of one embodiment of the present invention. FIG. 14B is a block diagram illustrating a structure example of the display apparatus 300B. The display apparatus 300B includes the layer 10 over the layer 20, the layer 30 over the layer 10, and the sealing substrate 40 over the layer 30. The layer 30 includes the display portion 31, and the layer 60 is provided between the sealing substrate 40 and the display portion 31. The layer 10 includes the driving portion 11. In FIG. 15, in order to elucidate the structure of the display apparatus 300B, for example, the layer 20, the layer 30, the layer 60, the sealing substrate 40, and the like are illustrated separately.

Note that repeated description of components denoted by the same reference numerals as those in the display apparatus 300A illustrated in FIG. 12 and FIG. 13 is omitted in some cases.

Since the layer 20 is similar to the layer 20 included in the display apparatus 300A, the description of Structure Example 1 described above can be referred to as appropriate.

The driving portion 11 provided in the layer 10 includes the driving signal output circuit 24. In the structure of the display apparatus 300B, the display portion and the driving portion are provided in different layers, that is, the layer 10 and the layer 30. Thus, the area occupied by the display portion 31 can be increased. Note that although the driving signal output circuit 24 included in the driving portion 11 and the pixel circuit 51 included in the display portion 31 are provided in different layers, they each have a structure including the OS transistor.

In the structure of the display apparatus 300B of one embodiment of the present invention, the driving portion 11 can be provided in the layer 10 that is different from the layer 30 provided with the display portion 31. Thus, the display area of the display portion 31 included in the display apparatus 300B can be increased.

As described above, the display apparatus 300B of one embodiment of the present invention has a structure in which a layer including the display portion 31, a layer including the driving portion 11, and a layer including the functional circuit 90 are stacked. Stacking layers provided with the circuits can reduce the size of the display apparatus 300B. In addition, since the driving signal generation circuit 23 can be provided to overlap with the display portion 31, the area of the display portion 31 can be enlarged. Thus, the definition of the display portion 31 can be increased, so that the display quality of the display apparatus 300B can be increased.

In addition, by stacking a layer including the display portion 31, a layer including the driving portion 11, and a layer including the functional circuit 90, wirings electrically connected to each other can be shortened. Thus, the wiring resistance and the parasitic capacitance can be reduced, and the operation speed of the display apparatus 300B can be increased. Furthermore, power consumption of the display apparatus 300B is reduced.

At least part of the structure examples, the drawings corresponding thereto, and the like described in this embodiment can be combined with the other structure examples, the other drawings, and the like as appropriate.

Embodiment 5

In this embodiment, a structure example of a display apparatus including a semiconductor device of one embodiment of the present invention will be described.

Structure Example 1

Figure 16:
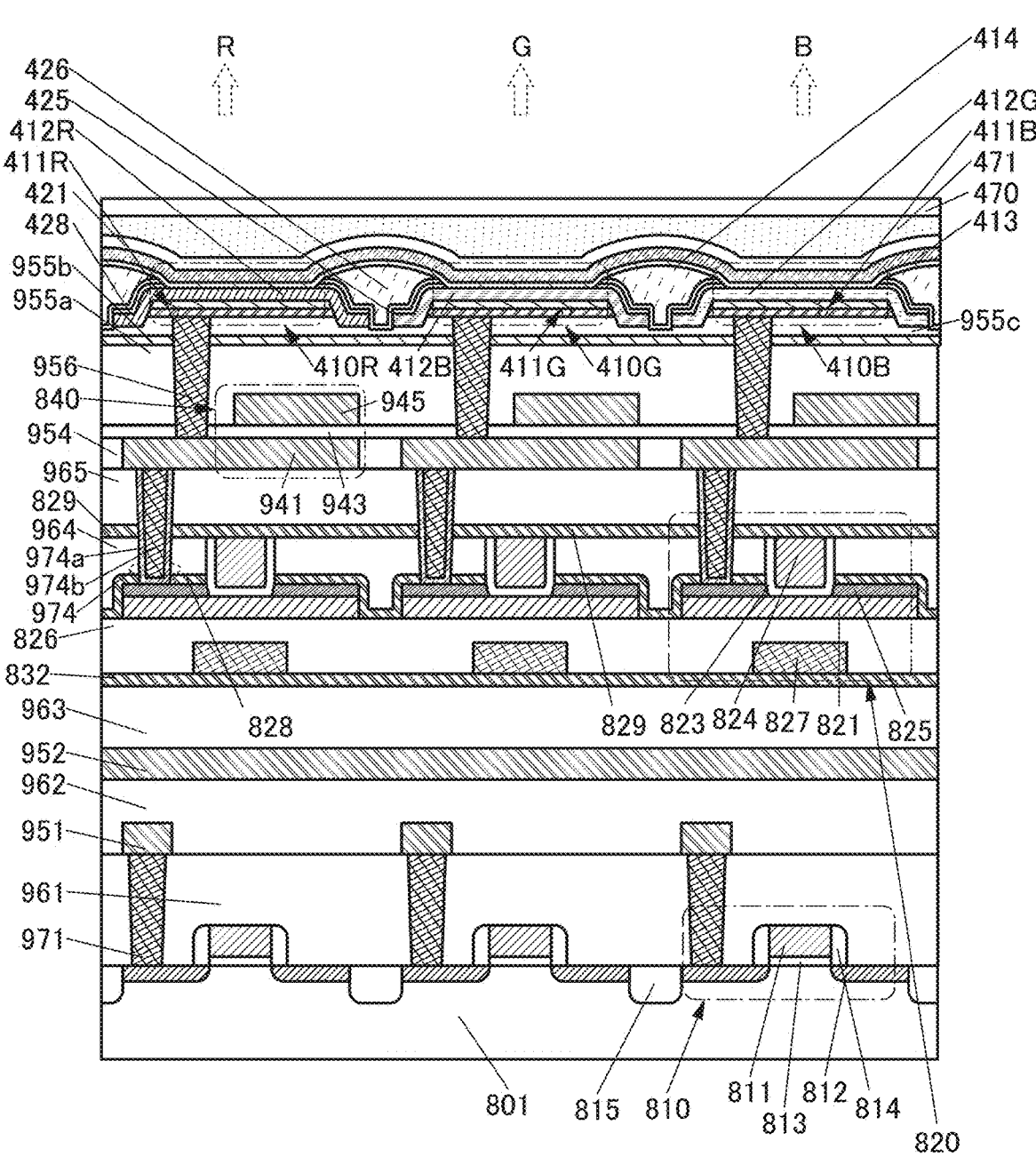
FIG. 16 is a diagram illustrating a structure example of a display apparatus.

The display apparatus 200A illustrated in FIG. 16 has a structure in which a transistor 810 whose channel is formed in a substrate 801 and a transistor 820 including a metal oxide in the semiconductor layer where a channel is formed are stacked.

The transistor 810 is a transistor including a channel formation region in the substrate 801. As the substrate 801, a semiconductor substrate such as a single crystal silicon substrate can be used, for example. The transistor 810 includes part of the substrate 801, a conductive layer 811, a low-resistance region 812, an insulating layer 813, and an insulating layer 814. The conductive layer 811 functions as a gate electrode. The insulating layer 813 is located between the substrate 801 and the conductive layer 811 and functions as a gate insulating layer. The low-resistance region 812 is a region where the substrate 801 is doped with an impurity, and functions as one of a source and a drain. The insulating layer 814 is provided to cover a side surface of the conductive layer 811 and functions as an insulating layer.

In addition, an element isolation layer 815 is provided between two adjacent transistors 810 to be embedded in substrate 801.

An insulating layer 961 is provided to cover the transistor 810, and a conductive layer 951 is provided over the insulating layer 961. The conductive layer 951 is electrically connected to one of the source and the drain of the transistor 810 through a plug 971 embedded in the insulating layer 961. An insulating layer 962 is provided to cover the conductive layer 951, and a conductive layer 952 is provided over the insulating layer 962. The conductive layer 951 and the conductive layer 952 each function as a wiring. An insulating layer 963 and an insulating layer 832 are provided to cover the conductive layer 952, and the transistor 820 is provided over the insulating layer 832.

The transistor 820 is a transistor that includes a metal oxide (also referred to as an oxide semiconductor) in a semiconductor layer where a channel is formed (an OS transistor).

The transistor 820 includes a semiconductor layer 821, an insulating layer 823, a conductive layer 824, a pair of conductive layers 825, an insulating layer 826, and a conductive layer 827.

The insulating layer 832 is provided over the insulating layer 963. The insulating layer 832 functions as a barrier layer that prevents diffusion of impurities such as water or hydrogen from the insulating layer 963 into the transistor 820 and release of oxygen from the semiconductor layer 821 to the insulating layer 832 side. As the insulating layer 832, for example, a film through which hydrogen or oxygen is less likely to diffuse than through a silicon oxide film, such as an aluminum oxide film, a hafnium oxide film, or a silicon nitride film, can be used.

The conductive layer 827 is provided over the insulating layer 832, and the insulating layer 826 is provided to cover the conductive layer 827. The conductive layer 827 functions as a second gate electrode of the transistor 820, and part of the insulating layer 826 functions as a second gate insulating layer. An oxide insulating film such as a silicon oxide film is preferably used as at least part of the insulating layer 826 that is in contact with the semiconductor layer 821, for example. The top surface of the insulating layer 826 is preferably planarized.

The semiconductor layer 821 is provided over the insulating layer 826. The semiconductor layer 821 preferably includes a metal oxide (also referred to as an oxide semiconductor) film exhibiting semiconductor characteristics. The pair of conductive layers 825 are provided over and in contact with the semiconductor layer 821 and function as a source electrode and a drain electrode.

An insulating layer 828 is provided to cover the top surface and the side surface of the pair of conductive layers 825, the side surface of the semiconductor layer 821, and the like, and an insulating layer 964 is provided over the insulating layer 828. The insulating layer 828 functions as a barrier layer that prevents diffusion of impurities such as water or hydrogen from the insulating layer 964 and the like into the semiconductor layer 821 and release of oxygen from the semiconductor layer 821. As the insulating layer 828, an insulating film similar to the insulating layer 832 can be used.

An opening reaching the semiconductor layer 821 is provided in the insulating layer 828 and the insulating layer 964. The insulating layer 823, which is in contact with the top surface of the semiconductor layer 821, and the conductive layer 824 are embedded in the opening. The conductive layer 824 functions as a first gate electrode, and the insulating layer 823 functions as a first gate insulating layer.

The top surface of the conductive layer 824, the top surface of the insulating layer 823, and the top surface of the insulating layer 964 are subjected to planarization treatment so as to be level with or substantially level with each other, and an insulating layer 829 and an insulating layer 965 are provided to cover these layers.

The insulating layer 964 and the insulating layer 965 each function as an interlayer insulating layer. The insulating layer 829 functions as a barrier layer that prevents diffusion of impurities such as water and hydrogen from the insulating layer 965 or the like into the transistor 820. For the insulating layer 829, an insulating film similar to the insulating layer 828 and the insulating layer 832 can be used.

A plug 974 electrically connected to one of the pair of conductive layers 825 is provided so as to be embedded in the insulating layer 965, the insulating layer 829, the insulating layer 964, and the insulating layer 828. Here, the plug 974 preferably includes a conductive layer 974*a* that covers the side surface of an opening of the insulating layer 965, the insulating layer 829, the insulating layer 964, and the insulating layer 828 and part of the top surface of the conductive layer 825, and a conductive layer 974*b* in contact with the top surface of the conductive layer 974*a*. In this case, a conductive material in which hydrogen and oxygen are less likely to diffuse is preferably used for the conductive layer 974*a*.

In addition, a capacitor 840 is provided over the insulating layer 965. The capacitor 840 and the transistor 820 are electrically connected to each other through the plug 974.

The transistor 820 can be used as a transistor included in the pixel circuit. The transistor 810 can be used as a transistor included in a variety of functional circuits (e.g., a control circuit, a sensor circuit, a communication circuit, or an input/output circuit) for driving the display apparatus. The transistor 810 and the transistor 820 can be used as transistors included in a driver circuit (a gate line driver circuit and a source line driver circuit) for driving the pixel circuit. Note that the driver circuit includes, for example, a driving signal generation circuit and a driving signal output circuit, and the transistor 810 can be used as a transistor included in the driving signal generation circuit, and the transistor 820 can be used as a transistor included in the driving signal output circuit.

A capacitor 840 includes a conductive layer 941, a conductive layer 945, and an insulating layer 943 located therebetween. The conductive layer 941 functions as one electrode of the capacitor 840, the conductive layer 945 functions as the other electrode of the capacitor 840, and the insulating layer 943 functions as a dielectric of the capacitor 840.

The conductive layer 941 is provided over the insulating layer 965 and is embedded in the insulating layer 954. The conductive layer 941 is electrically connected to one of a source and a drain of the transistor 820 through a plug 974 embedded in the insulating layer 965, the insulating layer 829, the insulating layer 964, and the insulating layer 828. The insulating layer 943 is provided to cover the conductive layer 941. The conductive layer 945 is provided in a region overlapping with the conductive layer 941 with the insulating layer 943 therebetween.

An insulating layer 955a is provided to cover the capacitor 840, an insulating layer 955b is provided over the insulating layer 955a, and an insulating layer 955c is provided over the insulating layer 955b.

An inorganic insulating film can be suitably used for each of the insulating layer 955a, the insulating layer 955b, and the insulating layer 955c. For example, it is preferable that a silicon oxide film be used for each of the insulating layer 955a and the insulating layer 955c and that a silicon nitride film be used for the insulating layer 955b. This enables the insulating layer 955b to function as an etching protective film. Although this embodiment shows an example in which the insulating layer 955c is partly etched and a concave portion is formed, the concave portion is not necessarily provided in the insulating layer 955c.

The light-emitting device 410R, the light-emitting device 410G, and the light-emitting device 410B are provided over the insulating layer 955c.

In the display apparatus 200A, since the light-emitting devices of different colors are separately formed, a change in chromaticity between light emission at low luminance and light emission at high luminance is small. Furthermore, since the organic layer 412R, the organic layer 412G, and the organic layer 412B are separated from each other, crosstalk generated between adjacent subpixels can be inhibited while the display panel has high definition. Accordingly, the display panel can have high resolution and high display quality.

In a region between adjacent light-emitting devices, the insulating layer 425, the resin layer 426, and the layer 428 are provided.

A pixel electrode 411R, a pixel electrode 411G, and a pixel electrode 411B of the light-emitting devices are each electrically connected to one of the source and the drain of the transistor 820 through a plug 956 embedded in the insulating layer 943, the insulating layer 955a, the insulating layer 955b, and the insulating layer 955c, the conductive layer 941 embedded in the insulating layer 954, and the plug 974 embedded in the insulating layer 965, the insulating layer 829, the insulating layer 964, and the insulating layer 828. The level of the top surface of the insulating layer 955c is equal to or substantially equal to the level of the top surface of the plug 956. A variety of conductive materials can be used for the plugs.

A common layer 414 is provided over a light-emitting device 410R, a light-emitting device 410G, and a light-emitting device 410B. A conductive layer 413 is provided over the common layer 414. A protective layer 421 is provided over the conductive layer 413. A substrate 470 is attached onto the protective layer 421 with an adhesive layer 471.

An insulating layer covering an end portion of the top surface of the pixel electrode 411 is not provided between two adjacent pixel electrodes 411. Thus, the distance between adjacent light-emitting devices can be extremely shortened. Accordingly, the display apparatus can have high resolution or high definition.

With such a structure, for example, not only the pixel circuit but also the driver circuit and the like can be formed directly under the light-emitting devices; thus, the display panel can be downsized as compared with the case where a driver circuit is provided around a display region.

Structure Example 2

Figure 17:
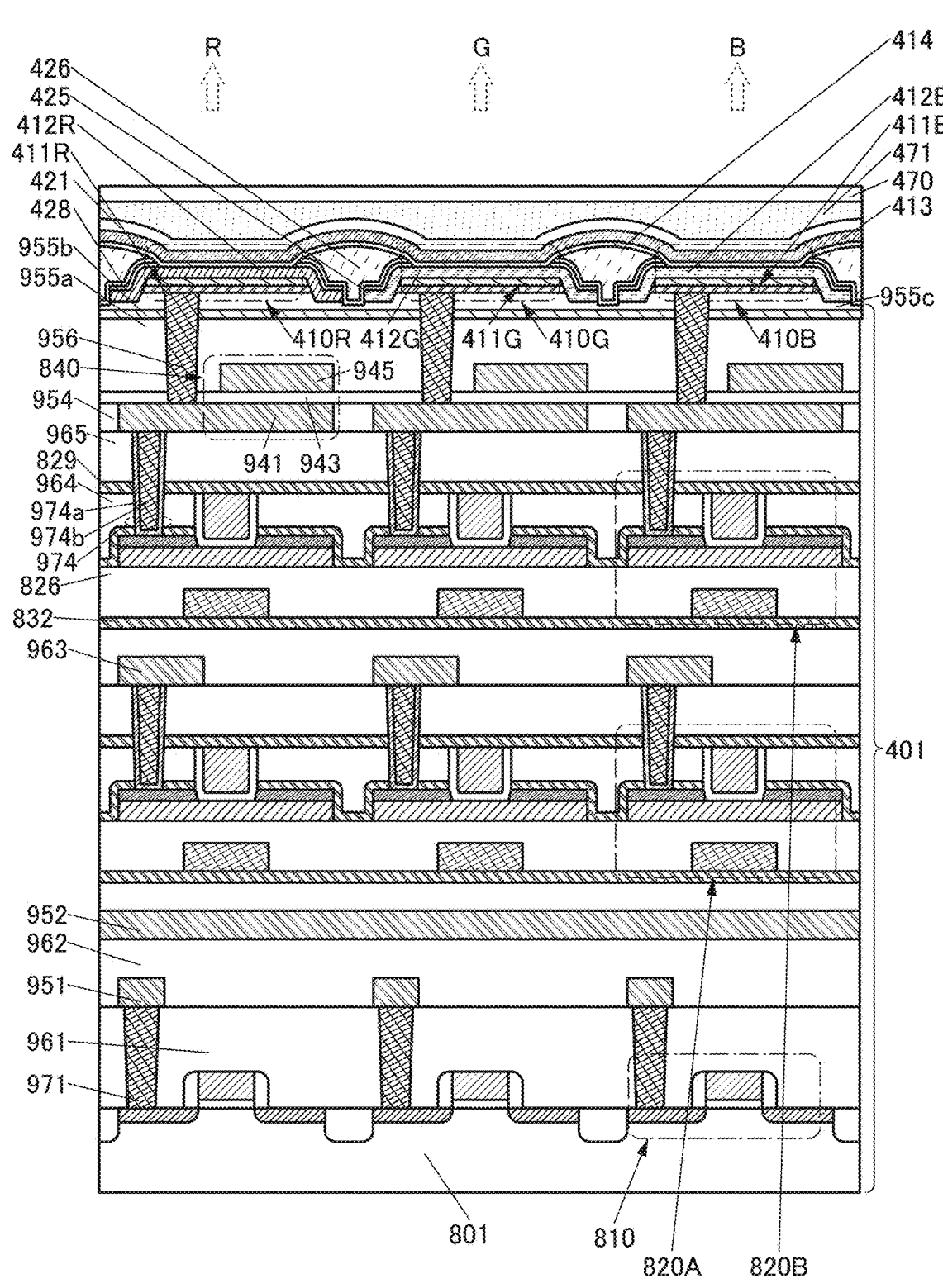
FIG. 17 is a diagram illustrating a structure example of a display apparatus.

A display apparatus 200B illustrated in FIG. 17 has a structure in which a transistor 820A including a metal oxide in a semiconductor layer where a channel is formed and a transistor 820B including a metal oxide in a semiconductor layer where a channel is formed are stacked. With this structure, transistors that differ in the composition of the constituent elements in the metal oxide in the semiconductor layer can be used. Thus, the display apparatus can be formed using OS transistors with different transistor characteristics. For example, the transistor 820A in the upper layer can be used as a transistor of a pixel circuit for driving the light-emitting device. Furthermore, for example, the transistor 820B in the lower layer can be used as a transistor of a driving signal output circuit included in a driver circuit for driving the pixel circuit.

With such a structure, the circuits provided directly under the light-emitting devices can be arranged with higher density; thus, the display panel can be downsized as compared with the case where a driver circuit is provided around a display region.

At least part of this embodiment can be implemented in combination with the other embodiments described in this specification and the like as appropriate.

Embodiment 6

In this embodiment, a metal oxide (hereinafter also referred to as an oxide semiconductor) that can be used for the OS transistor described in the above embodiment will be described.

The metal oxide used for the OS transistor preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and is further preferably gallium.

For example, the metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) structures, and the like can be given as examples of a crystal structure of an oxide semiconductor.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, the In—Ga—Zn oxide film deposited at room temperature is in an intermediate state, which is neither a single crystal nor polycrystal nor an amorphous state. Therefore, it is difficult to conclude that In—Ga—Zn oxide film is in an amorphous state.

[Structure of Oxide Semiconductor]

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductors include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a plurality of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Note that indium and gallium can be replaced with each other. Therefore, indium may be contained in the (Ga, Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS, for example.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. For example, a pentagonal lattice arrangement, a heptagonal lattice arrangement, and the like are included in the distortion in some cases. Note that it is difficult to observe a clear grain boundary even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region includes indium oxide, indium zinc oxide, or the like as its main component, for example. The second region includes gallium oxide, gallium zinc oxide, or the like as its main component, for example. That is, the first region can be rephrased as a region containing In as its main component. The second region can be rephrased as a region containing Ga as its main component.

Note that in some cases, it is difficult to observe a clear boundary between the first region and the second region.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure where metal elements are unevenly distributed.

The CAC-OS can be formed by a sputtering method under a condition where a substrate is not heated intentionally, for example. Furthermore, in the case where the CAC-OS is formed by a sputtering method, any one or more selected from an inert gas (typically, argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region is a region having a higher insulating property than the first region. In other words, when the second regions are distributed in a metal oxide, leakage current can be inhibited.

Thus, in the case where the CAC-OS is used for a transistor, a switching function (on state/off state switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, high on-state current ($I_{on}$), a high field-effect mobility ($\mu$), and favorable switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for the semiconductor layer where a channel is formed. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor, the impurity concentration in the oxide semiconductor is reduced so that the density of defect states in the oxide semiconductor can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the semiconductor layer is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The structure described in this embodiment can be used in appropriate combination with any of the other structures described in the other embodiments.

Embodiment 7

In this embodiment, electronic devices in which the semiconductor device of one embodiment of the present invention can be used will be described.

The semiconductor device of one embodiment of the present invention can be used for a display portion of an electronic device. Thus, one embodiment of the present invention can achieve an electronic device having high display quality. Another embodiment of the present invention can achieve an electronic device with extremely high definition. Another embodiment of the present invention can achieve a highly reliable electronic device.

Examples of electronic devices using the semiconductor device or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The semiconductor device of one embodiment of the present invention can display a high-definition image. Thus, the semiconductor device can be suitably used especially for a portable electronic device, a wearable electronic device (wearable device), an e-book reader, or the like. For example, the semiconductor device can be suitably used for xR devices such as a VR device and an AR device.

Figure 18A:
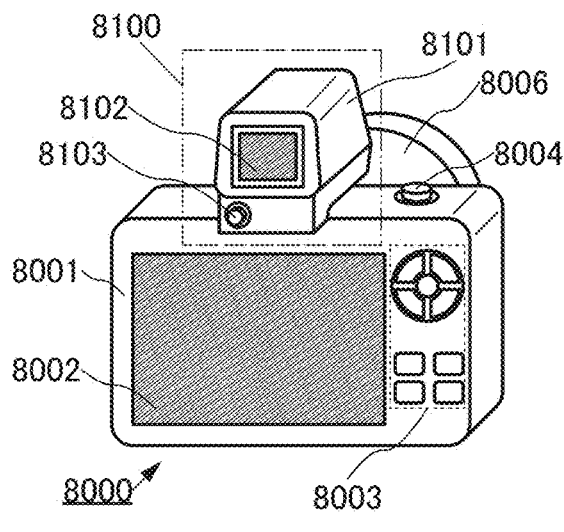
FIG. 18A to FIG. 18F are diagrams each illustrating an example of an electronic device.

FIG. 18A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The semiconductor device of one embodiment of the present invention can be used in the display portion 8002 of the camera 8000 and the display portion 8102 of the finder 8100. Note that the finder 8100 may be incorporated in the camera 8000.

Figure 18B:
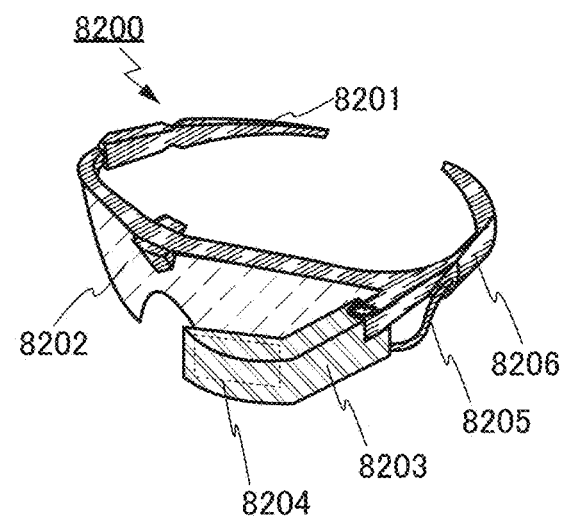

FIG. 18B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The semiconductor device of one embodiment of the present invention can be used in the display portion 8204.

Figure 18C:
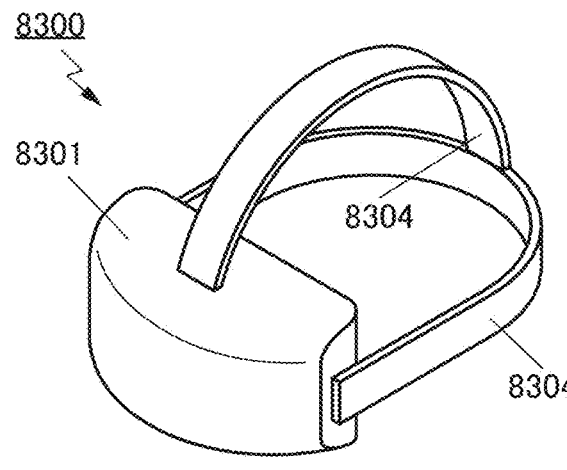
Figure 18D:
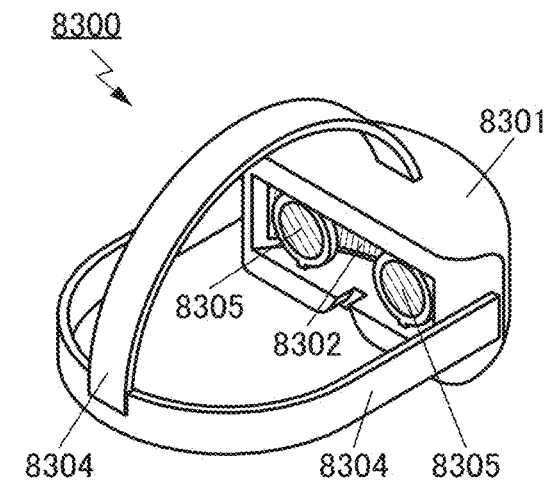
Figure 18E:
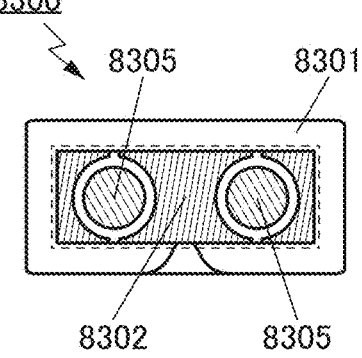

FIG. 18C to FIG. 18E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 18E. That is, an image with a strong sense of reality can be seen by the user with the use of the display portion 8302.

Figure 18F:
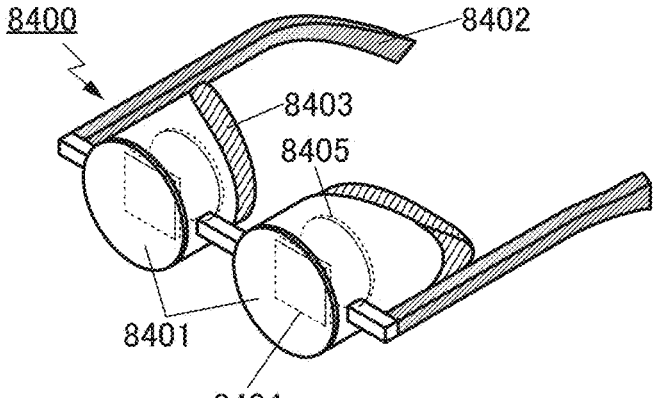

FIG. 18F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

FIG. 19A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000 in FIG. 19A.

Operation of the television device 7100 illustrated in FIG. 19A can be performed with an operation switch provided in the housing 7101 or a separate remote controller 7111. Furthermore, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

FIG. 19B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000 in FIG. 19B.

FIG. 19C and FIG. 19D illustrate examples of digital signage.

Digital signage 7300 illustrated in FIG. 19C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 19D illustrates digital signage 7400 attached to a cylindrical pillar. The digital signage 7400 includes the display portion 7000 provided along a curved surface of the pillar 7401.

In FIG. 19C and FIG. 19D, the semiconductor device of one embodiment of the present invention can be used for the display portion 7000.

The digital signage 7300 or the digital signage 7400 including a larger area of the display portion 7000 can increase the amount of information that can be provided at a time. The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 19C and FIG. 19D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 19E illustrates an example of an information terminal. An information terminal 7550 includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 can have a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

FIG. 19F illustrates an example of a watch-type information terminal. An information terminal 7660 includes a housing 7661, a display portion 7662, a band 7663, a buckle 7664, an operation switch 7665, an input/output terminal 7666, and the like. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 20A:
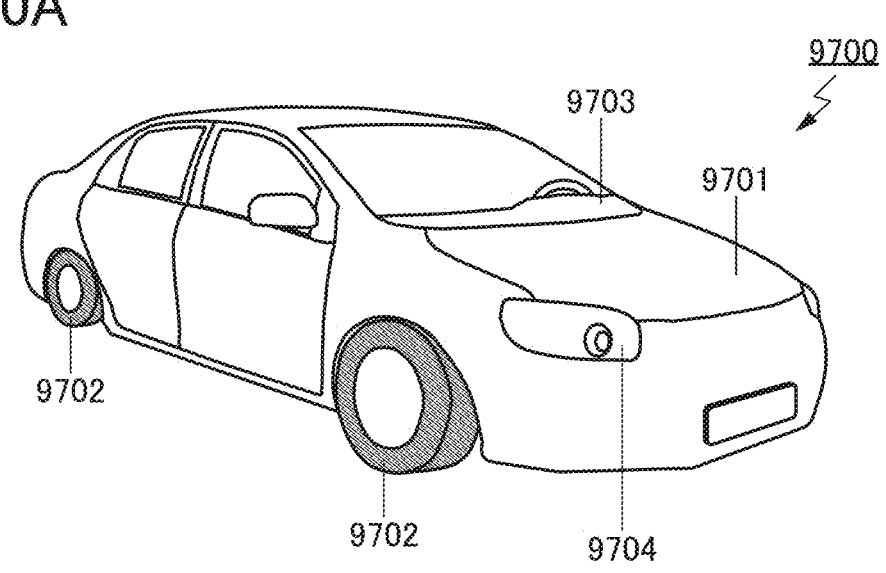
FIG. 20A and FIG. 20B are diagrams each illustrating an example of an electronic device.
Figure 20B:
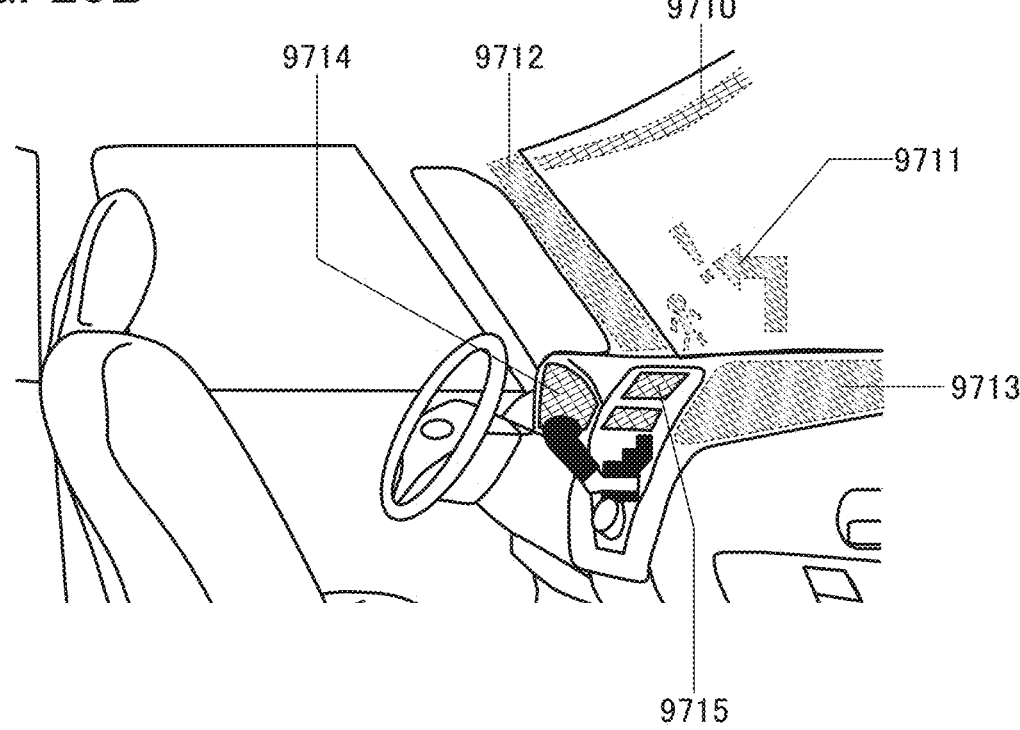

FIG. 20A is an external view of an automobile 9700. FIG. 20B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 20B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 21:
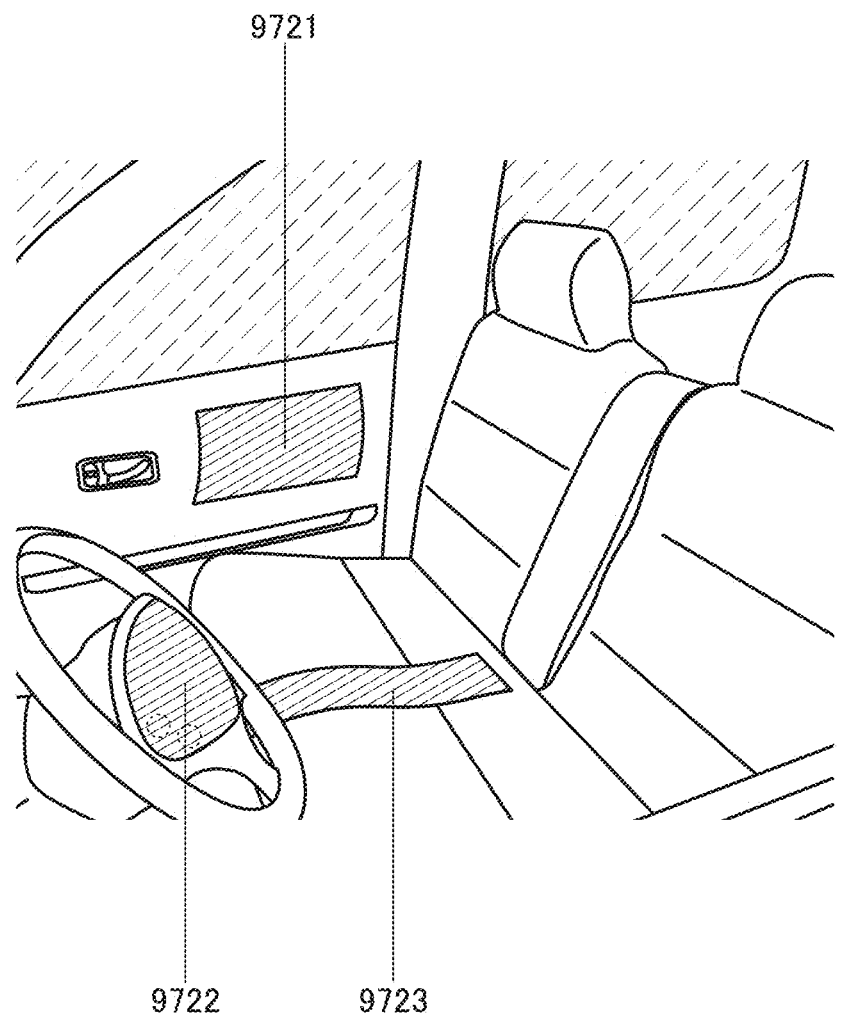
FIG. 21 is a diagram illustrating an example of an electronic device.

FIG. 21 illustrates the inside of an automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structure described in this embodiment can be used in appropriate combination with any of the other structures described in the other embodiments.

REFERENCE NUMERALS

10: layer, 11: driving portion, 20: layer, 21: control circuit, 23: driving signal generation circuit, 24: driving signal output circuit, 26: sensor circuit, 27: communication circuit, 28: input/output circuit, 29: terminal portion, 30: layer, 31: display portion, 40: sealing substrate, 50: pixel, 51: pixel circuit, 60: layer, 100A: semiconductor device, 100B: semiconductor device, 100C: semiconductor device, 101A: level shifter portion, 101Ain: input terminal portion, 101B: level shifter portion, 101Bin: input terminal portion, 101C: level shifter portion, 101Cin: input terminal portion, 102A: logic circuit portion, 102B: logic circuit portion, 102C: logic circuit portion, 103A: signal output portion, 103B: signal output portion, 103C: signal output portion, 104Aa: signal booster portion, 104Ab: signal booster portion, 104B: signal booster portion, 104C: signal booster portion, 105A_1: booster stage, 105A_2: booster stage, 105B_1: booster stage, 105B_2: booster stage, 105B_3: booster stage, 200A: display apparatus, 200B: display apparatus, 300A: display apparatus, 300B: display apparatus, 810: transistor, 820: transistor, 820A: transistor, 820B: transistor, 840: capacitor, BIAS: wiring, C11_1: capacitor, C11_2: capacitor, C12: capacitor, C21_1: capacitor, C21_2: capacitor, C21_3: capacitor, CK: wiring, CKB: wiring, IN: wiring, INB: wiring, M11: transistor, M12: transistor, M13_1: transistor, M13_2: transistor, M14_1: transistor, M14_2: transistor, M15_1: transistor, M15_2: transistor, M21: transistor, M22: transistor, M23_1: transistor, M23_2: transistor, M23_3: transistor, M24: transistor, M25: transistor, M31: transistor, M32: transistor, M33: transistor, M34: transistor, M35: transistor, N11_1: node, N11_2: node, N12_1: node, N12_2: node, N21_1: node, N21_2: node, N 21_3: node, N22: node, N31: node, OUT: wiring, P10: wiring, P11: wiring, P12: wiring, P13_1: wiring, P13_2: wiring, P14_1: wiring, P14_2: wiring, P20: wiring, P21: wiring, P22: wiring, P31: wiring, P32: wiring, R31: resistor, R32: resistor, RST: wiring, SW1: wiring, SW2: wiring, T11: Period, T12: Period, T13: Period, T14: Period, T15: Period, T21: Period, T22: Period, T23: Period, T31: Period, T32: Period, V10: potential, V13_1: potential, V13_2: potential, V14_1: potential, V14_2: potential, V20: potential, VDD: potential, VDDH: potential, VSS: potential This application is based on Japanese Patent Application Serial No. 2021-188587 filed on Nov. 19, 2021; the entire contents are hereby incorporated herein by reference.

The invention claimed is:

1. A semiconductor device comprising:

a first layer; and a second layer over the first layer, wherein the first layer comprises a logic circuit portion, wherein the second layer comprises a level shifter portion and a pixel circuit, wherein the level shifter portion comprises a first transistor, a second transistor, and a third transistor, wherein a gate of the first transistor is electrically connected to one of a source and a drain of the third transistor, wherein a gate of the second transistor is electrically connected to a first output terminal of the logic circuit portion, wherein the logic circuit portion is configured to output a first signal for operating the level shifter portion to an input terminal portion of the level shifter portion, wherein the level shifter portion is configured to supply a second signal with a larger amplitude than the first signal to the pixel circuit, wherein the logic circuit portion comprises a transistor comprising silicon in a semiconductor layer where a channel is formed, and wherein each of the level shifter portion and the pixel circuit comprises a transistor comprising a metal oxide in a semiconductor layer where a channel is formed.

2. The semiconductor device according to claim 1, the level shifter portion further comprising:

a fourth transistor;

a fifth transistor; and a capacitor, wherein one of a source and a drain of the first transistor is electrically connected to one of a source and a drain of the second transistor, wherein one of a source and a drain of the fourth transistor is electrically connected to a gate of the third transistor, wherein one of a source and a drain of the third transistor is electrically connected to one of a source and a drain of the fifth transistor, wherein one terminal of the capacitor is electrically connected to the gate of the third transistor, wherein a gate of the fifth transistor is electrically connected to a second output terminal of the logic circuit portion, and wherein the other terminal of the capacitor is electrically connected to a third output terminal of the logic circuit portion.

3. The semiconductor device according to claim 1, wherein the metal oxide comprises at least one of indium and zinc.

4. The semiconductor device according to claim 2, wherein the metal oxide comprises at least one of indium and zinc.

5. A semiconductor device comprising:

a first layer;

a second layer over the first layer; and a third layer over the second layer, wherein the first layer comprises a logic circuit portion, wherein the second layer comprises a level shifter portion, wherein the third layer comprises a pixel circuit, wherein the level shifter portion comprises a first transistor, a second transistor, and a third transistor, wherein a gate of the first transistor is electrically connected to one of a source and a drain of the third transistor, wherein a gate of the second transistor is electrically connected to a first output terminal of the logic circuit portion, wherein the logic circuit portion is configured to output a first signal for operating the level shifter portion to an input terminal portion of the level shifter portion, wherein the level shifter portion is configured to supply a second signal with a larger amplitude than the first signal to the pixel circuit, wherein the logic circuit portion comprises a transistor comprising silicon in a semiconductor layer where a channel is formed, and wherein each of the level shifter portion and the pixel circuit comprises a transistor comprising a metal oxide in a semiconductor layer where a channel is formed.

6. The semiconductor device according to claim 5, wherein the metal oxide comprises at least one of indium and zinc.

7. The semiconductor device according to claim 5, the level shifter portion further comprising:

a fourth transistor;

a fifth transistor; and a capacitor, wherein one of a source and a drain of the first transistor is electrically connected to one of a source and a drain of the second transistor, wherein one of a source and a drain of the fourth transistor is electrically connected to a gate of the third transistor, wherein one of a source and a drain of the third transistor is electrically connected to one of a source and a drain of the fifth transistor, wherein one terminal of the capacitor is electrically connected to the gate of the third transistor, wherein a gate of the fifth transistor is electrically connected to a second output terminal of the logic circuit portion, and wherein the other terminal of the capacitor is electrically connected to a third output terminal of the logic circuit portion.

8. The semiconductor device according to claim 7, wherein the metal oxide comprises at least one of indium and zinc.

* * * * *